(12) United States Patent
Lin et al.

(10) Patent No.: US 8,895,380 B2
(45) Date of Patent: Nov. 25, 2014

(54) METHOD OF MAKING SEMICONDUCTOR ASSEMBLY WITH BUILT-IN STIFFENER AND SEMICONDUCTOR ASSEMBLY MANUFACTURED THEREBY

(71) Applicant: Bridge Semiconductor Corporation, Taipei (TW)

(72) Inventors: Charles W.C. Lin, Singapore (SG); Chia-Chung Wang, Hsinchu (TW)

(73) Assignee: Bridge Semiconductor Corporation, Taipei (TW)

( * ) Notice: Subject to any disclaimer, the term of this patent is extended or adjusted under 35 U.S.C. 154(b) by 0 days.

(21) Appl. No.: 13/888,422

(22) Filed: May 7, 2013

(65) Prior Publication Data
US 2013/0292826 A1 Nov. 7, 2013

Related U.S. Application Data

(63) Continuation-in-part of application No. 13/738,220, filed on Jan. 10, 2013, now abandoned, and a continuation-in-part of application No. 13/532,941, filed on Jun. 26, 2012, now Pat. No. 8,865,525, and a continuation-in-part of application No. 13/299,472, (Continued)

(51) Int. Cl.
| | | |
|---|---|---|
| H01L 21/50 | (2006.01) |
| H01L 23/538 | (2006.01) |
| H01L 25/065 | (2006.01) |
| H05K 3/46 | (2006.01) |
| H01L 23/498 | (2006.01) |

(52) U.S. Cl.
CPC ....... *H01L 21/50* (2013.01); *H01L 2924/18162* (2013.01); *H01L 2224/92144* (2013.01); *H01L 23/5389* (2013.01); *H01L 2224/32225* (2013.01); *H01L 25/0657* (2013.01); *H05K 3/4644* (2013.01); *H01L 23/49811* (2013.01); *H01L 2224/9202* (2013.01); *H01L 23/5384* (2013.01); *H01L 2224/04105* (2013.01)
USPC ......................................................... 438/197

(58) Field of Classification Search
USPC .................. 257/737, 288; 438/118, 122, 613
See application file for complete search history.

(56) References Cited

U.S. PATENT DOCUMENTS

| | | |
|---|---|---|
| 6,050,832 A | 4/2000 | Lee et al. |
| 6,281,042 B1 | 8/2001 | Ahn et al. |
| 6,434,017 B1 | 8/2002 | Iwabuchi |
| 6,570,248 B1 | 5/2003 | Ahn et al. |
| 7,164,198 B2 | 1/2007 | Nakamura et al. |

(Continued)

*Primary Examiner* — Thao P Le
(74) *Attorney, Agent, or Firm* — Bacon & Thomas, PLLC

(57) ABSTRACT

The present invention relates to a method of making a semiconductor assembly. In accordance with a preferred embodiment, the method includes: preparing a dielectric layer and a supporting board including a stiffener, a bump/flange sacrificial carrier and an adhesive, wherein the adhesive bonds the stiffener to the sacrificial carrier and the dielectric layer covers the supporting board; then removing the bump and a portion of the flange to form a cavity and expose the dielectric layer; then mounting a semiconductor device into the cavity; and then forming a build-up circuitry that includes a first conductive via in direct contact with the semiconductor device and provides signal routing for the semiconductor device. Accordingly, the direct electrical connection between the semiconductor device and the build-up circuitry is advantageous to high I/O and high performance, and the stiffener can provide adequate mechanical support for the build-up circuitry and the semiconductor device.

16 Claims, 19 Drawing Sheets

Related U.S. Application Data filed on Nov. 18, 2011, and a continuation-in-part of application No. 13/298,391, filed on Nov. 17, 2011, now Pat. No. 8,841,171, and a continuation-in-part of application No. 13/287,374, filed on Nov. 2, 2011, and a continuation-in-part of application No. 13/267,946, filed on Oct. 7, 2011, now abandoned, and a continuation-in-part of application No. 13/197,163, filed on Aug. 3, 2011, now abandoned, said application No. 13/299,472 is a continuation-in-part of application No. 13/197,163, filed on Aug. 3, 2011, now abandoned, said application No. 13/532,941 is a continuation-in-part of application No. 13/299,495, filed on Nov. 18, 2011, now Pat. No. 8,343,808.

(60) Provisional application No. 61/643,514, filed on May 7, 2012, provisional application No. 61/415,862, filed on Nov. 22, 2010, provisional application No. 61/635,902, filed on Apr. 20, 2012.

(56) References Cited

U.S. PATENT DOCUMENTS

| | | | |
|---|---|---|---|
| 7,400,035 | B2 | 7/2008 | Abe et al. |
| 7,582,961 | B2 | 9/2009 | Chia et al. |
| 7,738,258 | B2 | 6/2010 | Ohno et al. |
| 7,934,313 | B1 | 5/2011 | Lin et al. |
| 8,108,993 | B2 | 2/2012 | Higashi et al. |
| 8,143,097 | B2 | 3/2012 | Chi et al. |
| 8,143,531 | B2 | 3/2012 | Miki et al. |
| 8,183,089 | B2 | 5/2012 | Choi et al. |
| 8,263,434 | B2 | 9/2012 | Pagaila et al. |
| 8,269,337 | B2 | 9/2012 | Hu et al. |
| 8,368,187 | B2 | 2/2013 | Pagaila |
| 8,379,400 | B2 | 2/2013 | Sunohara |
| 8,405,197 | B2 | 3/2013 | Ha et al. |
| 2008/0036082 | A1* | 2/2008 | Eun ............... 257/737 |
| 2008/0157322 | A1* | 7/2008 | Tang et al. ............... 257/686 |
| 2008/0237888 | A1* | 10/2008 | Hayasaka et al. ............... 257/777 |
| 2009/0032966 | A1* | 2/2009 | Lee et al. ............... 257/774 |

\* cited by examiner

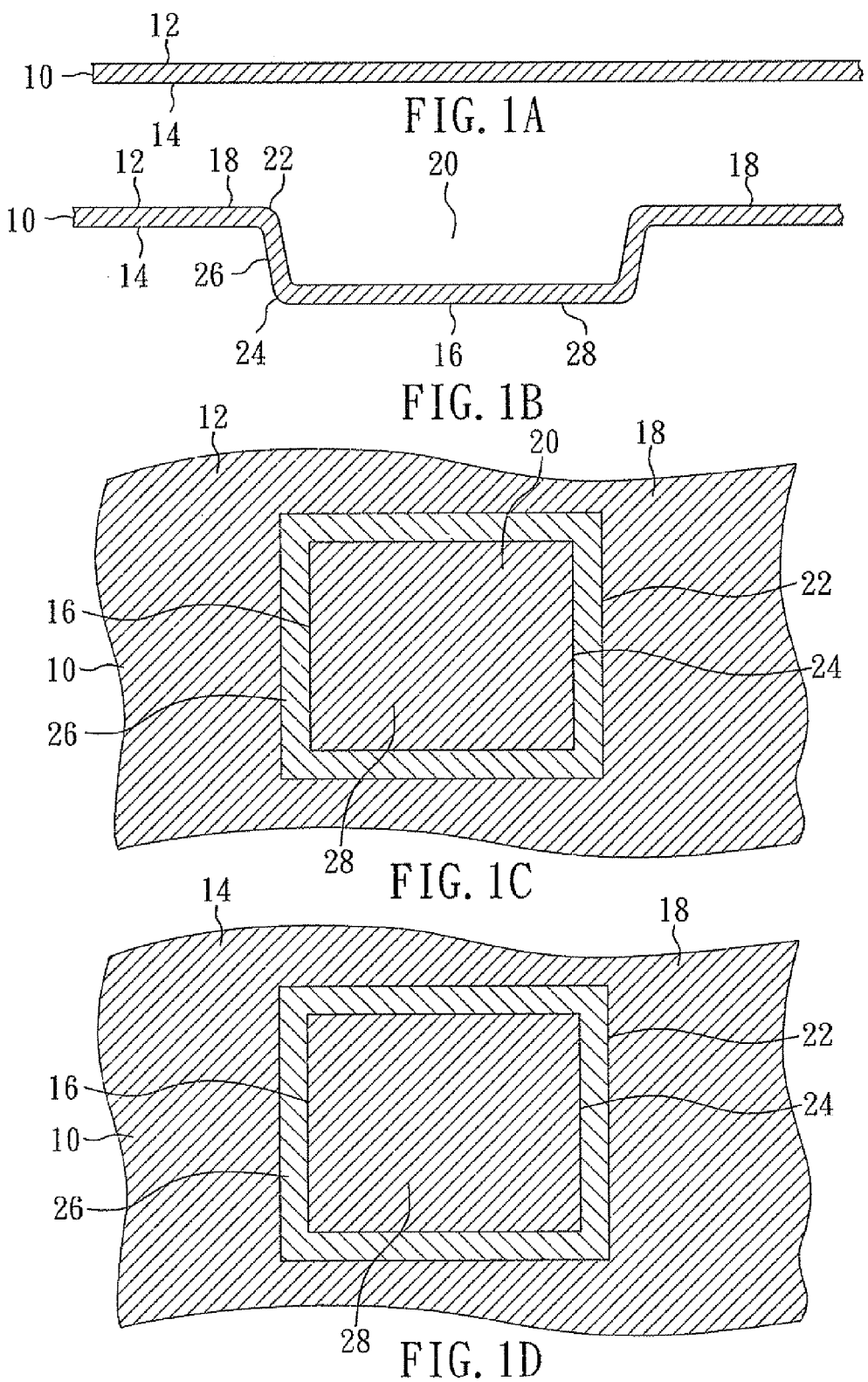

METHOD OF MAKING SEMICONDUCTOR ASSEMBLY WITH BUILT-IN STIFFENER AND SEMICONDUCTOR ASSEMBLY MANUFACTURED THEREBY

CROSS REFERENCE TO RELATED APPLICATION

This application is a continuation-in-part of U.S. application Ser. No. 13/197,163 filed Aug. 3, 2011, a continuation-in-part of U.S. application Ser. No. 13/267,946 filed Oct. 7, 2011, a continuation-in-part of U.S. application Ser. No. 13/287,374 filed Nov. 2, 2011, a continuation-in-part of U.S. application Ser. No. 13/299,472 filed Nov. 18, 2011, a continuation-in-part of U.S. application Ser. No. 13/299,495 filed Nov. 18, 2011, a continuation-in-part of U.S. application Ser. No. 13/298,391 filed Nov. 17, 2011, a continuation-in-part of U.S. application Ser. No. 13/532,941 filed Jun. 26, 2012 and a continuation-in-part of U.S. application Ser. No. 13/738,220 filed Jan. 10, 2013, each of which is incorporated by reference. This application also claims the benefit of filing date of U.S. Provisional Application Ser. No. 61/643,514 filed May 7, 2012.

U.S. application Ser. No. 13/197,163 filed Aug. 3, 2011, U.S. application Ser. No. 13/267,946 filed Oct. 7, 2011, U.S. application Ser. No. 13/287,374 filed Nov. 2, 2011, U.S. application Ser. No. 13/299,472 filed Nov. 18, 2011, U.S. application Ser. No. 13/299,495 filed Nov. 18, 2011 and U.S. application Ser. No. 13/298,391 filed Nov. 17, 2011 all claim the benefit of filing date of U.S. Provisional Application Ser. No. 61/415,862 filed Nov. 22, 2010. U.S. application Ser. No. 13/532,941 filed Jun. 26, 2012 and U.S. application Ser. No. 13/738,220 filed Jan. 10, 2013 claim the benefit of filing date of U.S. Provisional Application Ser. No. 61/635,902 filed Apr. 20, 2012.

U.S. application Ser. No. 13/299,472 filed Nov. 18, 2011 is a continuation-in-part of U.S. application Ser. No. 13/197,163 filed Aug. 3, 2011. U.S. application Ser. No. 13/299,495 filed Nov. 18, 2011 is a continuation-in-part of U.S. application Ser. No. 13/267,946 filed Oct. 7, 2011. U.S. application Ser. No. 13/298,391 filed Nov. 17, 2011 is a continuation-in-part of U.S. application Ser. No. 13/287,374 filed Nov. 2, 2011. U.S. application Ser. No. 13/532,941 filed Jun. 26, 2012 is a continuation-in-part of U.S. application Ser. No. 13/197,163 filed Aug. 3, 2011, a continuation-in-part of U.S. application Ser. No. 13/267,946 filed Oct. 7, 2011, a continuation-in-part of U.S. application Ser. No. 13/299,472 filed Nov. 18, 2011 and a continuation-in-part of U.S. application Ser. No. 13/299,495 filed Nov. 18, 2011. U.S. application Ser. No. 13/738,220 filed Jan. 10, 2013 is a continuation-in-part of U.S. application Ser. No. 13/532,941 filed Jun. 26, 2012.

BACKGROUND OF THE INVENTION

1. Field of the Invention

The present invention relates to a method of making a semiconductor assembly and a semiconductor assembly manufactured thereby, and more particularly to a method of making a semiconductor assembly with semiconductor device in a cavity defined by a bump/flange sacrificial carrier and a semiconductor assembly manufactured thereby.

2. Description of Related Art

Latest trends of electronic devices such as mobile internet devices (MIDs), multimedia devices and computer notebooks demand for faster and slimmer designs. In the frequency band of a general signal, the shorter paths of circuitry, the better the signal integrity. Thus, the size of inter-layer connection, i.e., the diameter of the micro-via and plated through hole in the substrate must be reduced in order to improve the signal delivery characteristic of the electronic component. As plated-through-hole in the copper-clad laminate core is typically formed by mechanical CNC drill, reducing its diameter in order to increase wiring density may encounter seriously technical limitations and often very costly. As such, coreless substrates are proposed for packaging substrate to enable a thinner, lighter and faster design of the components. However, as coreless boards do not have a core layer to provide a necessary flexural rigidity, they are more susceptible to warpage problem when under thermal stress compared to that of conventional boards with core layers.

U.S. Pat. No. 7,164,198 to Nakamura et al., U.S. Pat. No. 7,400,035 to Abe et al., U.S. Pat. No. 7,582,961 to Chia et al., U.S. Pat. No. 7,934,313 to Lin et al. disclose a coreless packaging substrate with built-in stiffener by etching a portion of a metal sheet on which the build-up circuitry is formed. The built-in stiffener defines a cavity which serves as the region for semiconductor device attachment. In this approach, although a supporting platform can be created and warping issues may be improved, etching a thick metal block is prohibitively cumbersome, low throughput, and prone to create many yield-loss issues such as an uncontrollable boundary line due to etching under-cut.

U.S. Pat. No. 8,108,993 to Higashi et al. discloses a method to form built-in stiffener by using a supporting substrate on which the build-up circuitry is formed. In this approach, a peeling promotion layer is applied on the supporting substrate so that the build-up layers can be separated from the supporting substrate after the coreless wiring board is finished. Since the peeling promotion layer, either a thermal setting resin or an oxide film, has the peeling off property when under a heat or light treatment, there exists a high risk of early delamination during dielectric layer coating and curing, this may result in serious yield and reliability concerns.

In view of the various development stages and limitations in currently available coreless substrate for high I/O and high performance semiconductor devices, there is a need for a packaging technique that can provide optimize signal integrity, maintain low warping during assembly and operation, and low cost manufacturing.

SUMMARY OF THE INVENTION

The present invention has been developed in view of such a situation, and an object thereof is to provide a semiconductor assembly in which a semiconductor device extends into a well-defined cavity of a supporting board, warp and bend of the semiconductor device can be suppressed, and electrical connection between the semiconductor device and the build-up circuitry can be securely retained by conductive via.

In a preferred embodiment, the present invention provides a method of making a semiconductor assembly that includes a semiconductor device, a supporting board and build-up circuitry. The method for making the semiconductor assembly can include: providing a dielectric layer and a supporting board that includes a sacrificial carrier, a stiffener and an adhesive, wherein (i) the sacrificial carrier includes a bump and a flange, (ii) the bump is adjacent to and integral with the flange and extends from the flange in a first vertical direction, (iii) the flange extends laterally from the bump in lateral directions orthogonal to the first vertical direction, (iv) the stiffener is attached to the sacrificial carrier via the adhesive between the stiffener and the flange and between the stiffener and the bump, and (v) the dielectric layer covers the supporting board in the first vertical direction; removing the bump and a portion of the flange adjacent to the bump to form a cavity and expose the dielectric layer from a closed end of the cavity, wherein the cavity is laterally covered and surrounded by the adhesive and faces in a second vertical direction opposite the first vertical direction; mounting a semiconductor device into the cavity, wherein the semiconductor device includes an active surface with a contact pad thereon that faces the first vertical direction and an inactive surface that faces the second vertical direction; and forming a first build-up circuitry that covers the semiconductor device and the supporting board in the first vertical direction and includes a first conductive via that directly contacts the contact pad of the semiconductor device to provide an electrical connection between the semiconductor device and the first build-up circuitry.

Providing the supporting board can include: providing the sacrificial carrier that includes the bump and the flange; and attaching the stiffener to the sacrificial carrier via the adhesive between the stiffener and the flange and between the stiffener and the bump, including aligning the bump with an aperture of the stiffener.

In accordance with one aspect of the present invention, providing the supporting board and the dielectric layer can include: providing the sacrificial carrier that includes the bump and the flange; then attaching the stiffener to the sacrificial carrier via the adhesive between the stiffener and the flange and between the stiffener and the bump, including aligning the bump with the aperture of the stiffener; and then depositing the dielectric layer that covers the bump and the stiffener in the first vertical direction.

In accordance with another aspect of the present invention, providing the supporting board and the dielectric layer can include: providing the sacrificial carrier that includes the bump and the flange; and then attaching the stiffener to the sacrificial carrier via the adhesive between the stiffener and the flange and between the stiffener and the bump and simultaneously laminating the dielectric layer onto the sacrificial carrier at the bump and the stiffener, including aligning the bump with the aperture of the stiffener.

Attaching the stiffener to the sacrificial carrier via the adhesive can include: providing the adhesive that is non-solidified (such as a prepreg with uncured epoxy) between the flange of the sacrificial carrier and the stiffener, including aligning the bump of the sacrificial carrier with an opening of the adhesive and the aperture of the stiffener; then flowing the adhesive into a gap located in the aperture between the bump and the stiffener; and then solidifying the adhesive (such as curing the uncured epoxy).

Attaching the stiffener and simultaneously laminating the dielectric layer can include: providing the adhesive that is non-solidified and the stiffener between the flange of the sacrificial carrier and the dielectric layer, including aligning the bump with an opening of the adhesive and the aperture of the stiffener; then flowing the adhesive into a gap located in the aperture between the bump and the stiffener and compressing the dielectric layer onto the sacrificial carrier at the bump and the stiffener; and then solidifying the adhesive and the dielectric layer.

Flowing the adhesive into the gap can include: applying heat to melt the adhesive; and moving the sacrificial carrier and the stiffener towards one another, thereby moving the bump in the first vertical direction in the aperture and applying pressure to the molten adhesive between the flange and the stiffener, wherein the pressure forces the molten adhesive to flow in the first vertical direction into the gap located in the aperture between the bump and the stiffener.

Solidifying the adhesive can include applying heat to solidify the molten adhesive, thereby mechanically attaching the stiffener to the bump and the flange.

The method of making the semiconductor assembly according to the present invention can further include providing a plated through-hole that extends through the supporting board to provide an electrical connection between both sides of the assembly. For instance, the method of making the semiconductor assembly according to the present invention can further include: providing a terminal that extends beyond the adhesive in the second vertical direction; and providing a plated through-hole that extends through the supporting board to provide an electrical connection between the terminal and the first build-up circuitry. Alternatively, the method of making the semiconductor device according to the present invention can further include: forming a second build-up circuitry that covers the semiconductor device and the supporting board in the second vertical direction; and providing a plated through-hole that extends through the supporting board in the vertical directions to provide an electrical connection between the first build-up circuitry and the second build-up circuitry.

Providing the terminal can include removing a selected portion of the flange. That is, the terminal can be a remaining portion of the flange and adjacent to the plated through-hole and extend from the adhesive in the second vertical direction. In consideration of process efficiency, the terminal can be simultaneously defined during removal of the bump and the portion of the flange adjacent to the bump. That is, removing the bump and the portion of the flange adjacent to the bump can include simultaneously removing another selected portion of the flange to define the terminal. The terminal can be used for grounding or serve as an electrical contact for the next level assembly or another electronic device.

The first build-up circuitry can include a first insulating layer and one or more first conductive traces, while the second build-up circuitry can include a second insulating layer and one or more second conductive traces. For instance, the first insulating layer covers the semiconductor device and the supporting board in the first vertical direction and the first conductive traces extend from the first insulating layer in the first vertical direction, while the second insulating layer covers the semiconductor device and the supporting board in the second vertical direction and the second conductive traces extend from the second insulating layer in the second vertical direction. As a result, forming the first build-up circuitry and the second build-up circuitry can include: providing a first insulating layer that includes the dielectric layer and covers the semiconductor device and the supporting board in the first vertical direction; providing a second insulating layer that covers the semiconductor device and the supporting board in the second vertical direction; forming one or more first via openings that extend through the first insulating layer and are aligned with one or more contact pads of the semiconductor device and optionally with the stiffener; optionally forming one or more second via openings that extend through the second insulating layer and are aligned with the inactive surface of the semiconductor device; forming one or more first conductive traces that extend from the first insulating layer in the first vertical direction and extend laterally on the first insulating layer and extend through the first via openings in the second vertical direction to form one or more first conductive vias in direct contact with the contact pads of the semiconductor device and optionally with the stiffener; and forming one or more second conductive trace that extend from the second insulating layer in the second vertical direction and extend laterally on the second insulating layer and optionally extend through the second via openings in the first vertical direction to form one or more second conductive vias in direct contact with the active surface of the semiconductor device. Accordingly, the first conductive traces can directly contact the contact pads to provide signal routing for the semiconductor device, and thus the electrical connection between the semiconductor device and the first build-up circuitry can be devoid of solder. Besides, the second conductive traces can directly contact the inactive surface of the semiconductor device to provide thermal dissipation pathway for the semiconductor device. The first conductive traces can also directly contact the stiffener for grounding or electrical connections to a conductive layer or passive components such as thin film resistors or capacitors deposited thereon.

The first and second via openings can be simultaneously formed, and the first and second conductive traces can be simultaneously deposited and patterned. The first and second via openings can have the same size. The first insulating layer and the first conductive traces can have flat elongated surfaces that face in the first vertical direction, while the second insulating layer and the second conductive traces can have flat elongated surfaces that face in the second vertical direction. Furthermore, the first and second build-up circuitries can further include additional insulating layers, additional via openings, and additional conductive, traces if needed for further signal routing.

The outmost conductive traces of the first and second build-up circuitries can respectively include one or more first and second interconnect pads to provide electrical contacts for the next level assembly or another electronic device such as a semiconductor chip, a plastic package or another semiconductor assembly. The first interconnect pads can include an exposed contact surface that faces in the first vertical direction, while the second interconnect pads can include an exposed contact surface that faces in the second vertical direction. As a result, the next level assembly or another electronic device can be electrically connected to the embedded semiconductor device using a wide variety of connection media including gold or solder bumps on the electrical contacts (i.e. the interconnect pads of the build-up circuitry).

Besides, the second build-up circuitry may further include a paddle layer that extends from an insulating layer of the second build-up circuitry and is thermally connected to the inactive surface of the semiconductor device through metallized thermal vias in the second build-up circuitry. For instance, the paddle layer can extend from the second insulating layer in the second vertical direction and have an exposed contact surface that faces in the second vertical direction and be integral with second conductive vias that can contact the inactive surface of the semiconductor device and serve as heat pipes for heat dissipation.

Forming the first conductive trace can include depositing a plated layer on the first insulating layer that extends through the first via opening to form the first conductive via and then removing selected portions of the plated layer using an etch mask that defines the first conductive trace. Likewise, forming the second conductive trace can include depositing a plated layer on the second insulating layer that optionally extends through the second via opening to form the second conductive via and then removing selected portions of the plated layer using an etch mask that defines the second conductive trace.

Providing the plated through-hole can include forming a through-hole that extends through the stiffener and the adhesive in the vertical directions, and then depositing a connecting layer on an inner sidewall of the through-hole. As a result, the plated through-hole can provide an electrical connection between the first build-up circuitry and the terminal or between the first build-up circuitry and the second build-up circuitry, and the semiconductor assembly is stackable through the electrical contacts located on opposite surfaces of the assembly.

The through-hole can be provided before depositing the dielectric layer and extend through the adhesive and the stiffener in the vertical directions. Alternatively, the through-hole may be provided after depositing the dielectric layer and extend through the adhesive, the stiffener and one or more insulating layers of build-up circuitry in the vertical directions. The connecting layer of the plated through-hole can be deposited before forming conductive traces of build-up circuitry or be simultaneously deposited during forming outer or inner conductive traces of build-up circuitry.

In accordance with one embodiment of the present invention, the method of the present invention can include: forming the through-hole that extends through the supporting board in the vertical directions after attaching the stiffener to the sacrificial carrier; then providing an inner pad that extends from the stiffener in the first vertical direction and depositing the connecting layer on the inner sidewall of the through-hole that is adjacent to the inner pad; then providing the dielectric layer that covers the bump, the stiffener and the inner pad in the first vertical direction; then removing the bump and a portion of the flange adjacent to the bump to form the cavity; then mounting the semiconductor device into the cavity; then forming the first via opening and an additional first via opening in the dielectric layer, wherein the first via opening is aligned with the contact pad of the semiconductor device and the additional first via opening is aligned with the inner pad; and then providing the first conductive trace that extends from the dielectric layer in the first vertical direction and extends laterally on the dielectric layer and extends through the first via opening and the additional first via opening of the dielectric layer in the second vertical direction to form the first conductive via in contact with the contact pad and an additional first conductive via in contact with the inner pad. In this case, the plated through-hole can extend through the adhesive and the stiffener in the vertical directions, and the connecting layer of the plated through-hole can be simultaneously provided during depositing the inner pad.

Providing the inner pad can include: depositing a plated layer on the bump, the adhesive and the stiffener in the first vertical direction; then removing a selected portion of the plated layer to define the inner pad.

In accordance with another embodiment of the present invention, the method of the present invention can include: forming the through-hole that extends through the supporting board and the dielectric layer in the vertical directions after attaching the stiffener to the sacrificial carrier and providing the dielectric layer; then depositing the connecting layer on the inner sidewall of the through-hole; then removing the bump and a portion of the flange adjacent to the bump to form the cavity; then mounting the semiconductor device into the cavity; then forming the first via opening in the dielectric layer, wherein the first via opening is aligned with the contact pad of the semiconductor device; and then providing the first conductive trace that extends from the dielectric layer in the first vertical direction and extends laterally on the dielectric layer and extends through the first via opening of the dielectric layer in the second vertical direction to form the first conductive via in contact with the contact pad. In this case, the plated through-hole can extend through the adhesive, the stiffener and one insulating layer in the vertical directions.

In accordance with yet another embodiment of the present invention, the method of the present invention can include:

removing the bump and a portion of the flange adjacent to the bump to form the cavity after attaching the stiffener to the sacrificial carrier and providing the dielectric layer; then mounting the semiconductor device into the cavity; then forming the first via opening in the dielectric layer, wherein the first via opening is aligned with the contact pad of the semiconductor device; providing the first conductive trace that extends from the dielectric layer in the first vertical direction and extends laterally on the dielectric layer and extends through the first via opening in the second vertical direction to form the first conductive via in contact with the contact pad; forming the through-hole that extends through the adhesive, the stiffener and one or more insulating layers that include the dielectric layer in the vertical directions; and providing the connecting layer on the inner sidewall of the through-hole. In this case, the plated through-hole can extend through the adhesive, the stiffener and one insulating layer in the vertical directions, and the connecting layer of the plated through-hole can be provided during providing the first conductive trace. Also, the plated through-hole can extend through the flange, the adhesive, the stiffener and multiple insulating layers in the vertical directions, and the connecting layer of the plated through-hole can be provided during providing an additional conductive trace.

Accordingly, the plated though-hole at a first end can extend to and be electrically connected to an outer or inner conductive layer of the first build-up circuitry or an inner pad that extends beyond the stiffener in the first vertical direction, and at a second end can extend to and be electrically connected to an outer or inner conductive layer of the second build-up circuitry or a terminal that extends beyond the adhesive in the second vertical direction. In any case, the plated through-hole extends vertically through the adhesive and the stiffener in the vertical directions and is in an electrically conductive path between the first build-up circuitry and the second build-up circuitry or between the first build-up circuitry and the terminal.

Removing the bump and the portion of the flange adjacent to the bump can include chemical etching process and be performed after providing the dielectric layer and before mounting the semiconductor device. Accordingly, a cavity can be defined in the adhesive by removing the bump and have the same topography as the bump.

Mounting the semiconductor device can include mechanically attaching the semiconductor device to the dielectric layer with its inactive surface facing the dielectric layer using a die attach that is located within the cavity. The gap between the semiconductor device and the adhesive may be filled with the die attach. Alternatively, the second insulating layer may extend into the cavity and fill the gap between the semiconductor device and the adhesive.

The insulating layers can be deposited and extend to peripheral edges of the assembly by numerous techniques including film lamination, roll coating, spin coating and spray-on deposition. The via openings can be formed through the insulating layers by numerous techniques including laser drilling, plasma etching and photolithography. The through-hole can be formed by numerous techniques including mechanical drilling, laser drilling and plasma etching with or without wet etching. The plated layers and connecting layer can be deposited by numerous techniques including electroplating, electroless plating, evaporating, sputtering, and their combinations as a single layer or multiple layers. The plated layers can be patterned by numerous techniques including wet etching, electro-chemical etching, laser-assist etching, and their combinations to define the conductive traces.

The bump and the flange of the sacrificial carrier can be integral with each other and can be made of any material with good processability and good removability. For instance, the bump and the flange can be a single-piece metal or include a single-piece metal at their interface, and the single-piece metal can be copper, aluminum, nickel, iron, tin or their alloys. Moreover, the bump and the flange can be formed by a mechanical stamping process. For instance, providing the sacrificial carrier with the bump and the flange can include mechanically stamping a metal plate. The sacrificial carrier can further include a stamped cavity in the bump and the stamped cavity in the bump faces in the second vertical direction and is covered by the bump in the first vertical direction. The bump and the cavity in the bump can be a stamped portion of the metal plate and the flange can be an unstamped portion of the metal plate.

The bump can have a larger diameter or dimension in the second vertical direction than in the first vertical direction. For instance, the bump can have a cut-off conical or pyramidal shape in which its diameter or dimension decreases as it extends in the first vertical direction from the flange. Accordingly, as the adhesive extends into the gap between the bump and the stiffener in the first vertical direction, the adhesive can have an increasing thickness where it is adjacent to the bump. The bump can also have a cylindrical shape with a constant diameter. Accordingly, the adhesive can have a constant thickness in the gap between the bump and the stiffener.

The cavity in the bump can have a larger diameter or dimension at its entrance than at its floor. For instance, the stamped cavity can have a cut-off conical or pyramidal shape in which its diameter or dimension increases as it extends in the second vertical direction from its floor to its entrance. Alternatively, the stamped cavity can have a cylindrical shape with a constant diameter. The stamped cavity can also have a circular, square or rectangular periphery at its entrance and its floor. The stamped cavity can also conform to the shape of the bump, extend into the opening and the aperture and extend across most of the bump in the vertical and lateral directions.

The adhesive between the flange and the stiffener can flow into a gap located in the aperture between the bump and the stiffener, as above mentioned. Accordingly, the adhesive can contact the bump, the flange and the stiffener, extend laterally from the bump to peripheral edges of the assembly and have a first thickness (in the vertical directions) where it is adjacent to the flange and a second thickness (in the lateral directions) where it is adjacent to the bump that is different from the first thickness.

The sacrificial carrier may be entirely removed. However, it is preferable to reserve selected portions of the flange as a supporting platform for a heat sink attached thereon. Furthermore, the flange also can be processed into a terminal that can be electrically connected to the first build-up circuitry through the plated through-hole or be electrically connected to the second build-up circuitry through conductive vias.

By the above-mentioned method, the present invention can provide a semiconductor assembly that includes a cavity, an adhesive, a stiffener, a semiconductor device and a first build-up circuitry, wherein (i) the cavity has a closed end in the first vertical direction and an open end in the second vertical direction; (ii) the stiffener includes an aperture, wherein the cavity extends into the aperture; (iii) the adhesive laterally covers and surrounds and conformally coats a sidewall of the cavity, extends laterally from the cavity to peripheral edges of the assembly and covers and contacts the stiffener in the second vertical direction; (iv) the semiconductor device extends into the cavity and includes one or more contact pads that face the closed end of the cavity and an inactive surface that faces the open end of the cavity; and (v) the first build-up circuitry covers the semiconductor device, the adhesive and the stiffener in the first vertical direction and includes one or more first conductive vias that directly contact the contact pads of the semiconductor device and optionally the stiffener.

The semiconductor assembly provided by the present invention can further include: a terminal that extends beyond the adhesive in the second vertical direction and is spaced from the first build-up circuitry by the adhesive and the stiffener; and a plated through-hole that extends through the adhesive and the stiffener to provide an electrical connection between the first build-up circuitry and the terminal. As an alternative, the semiconductor assembly provided by the present invention may further include: a second build-up circuitry that covers the semiconductor device and the adhesive in the second vertical direction and optionally includes one or more second conductive vias in direct contact with the inactive surface of the semiconductor device; and a plated through-hole that extends through the stiffener and the adhesive in the vertical directions to provide an electrical connection between the first build-up circuitry and the second build-up circuitry.

The stiffener can extend to peripheral edges of the assembly to provide mechanical support for the build-up circuitry and can be made of organic materials such as copper-clad laminate. The stiffener can also be made of inorganic materials such as aluminum oxide ($Al_2O_3$), aluminum nitride (AlN), silicon nitride (SiN), silicon (Si), copper (Cu), aluminum (Al), stainless steel, etc. Alternatively, the stiffener can be a single layer structure or a multi-layer structure such as a circuit board or a multi-layer ceramic board or a laminate of a substrate and a conductive layer.

The adhesive can extend to peripheral edges of the assembly and the mechanical rigidity of the cured adhesive also can provide mechanical support for the build-up circuitry. Additionally, the adhesive can cover the stiffener in the second vertical direction and extend into the aperture of the stiffener and conformally coat the sidewall of the cavity. Accordingly, the adhesive can have a first thickness where it is adjacent to the sidewall of the cavity and a second thickness where it covers the stiffener in the second vertical direction that is different from the first thickness. The adhesive can be made of the materials that are at least one selected from the group consisting of epoxy resin, bismaleimide triazine (BT), benzocyclobutene (BCB), Ajinomoto build-up film (ABF), liquid crystal polymer, polyimide, poly(phenylene ether), poly(tetrafluorothylene), aramide and glass fiber.

The semiconductor device can be a packaged or unpackaged semiconductor chip. For instance, the semiconductor device can be a land grid array (LGA) package or wafer level package (WLP) that includes a semiconductor chip. Alternatively, the semiconductor device can be a semiconductor chip.

The assembly can be a first-level or second-level single-chip or multi-chip device. For instance, the assembly can be a first-level package that contains a single chip or multiple chips. Alternatively, the assembly can be a second-level module that contains a single package or multiple packages, and each package can contain a single chip or multiple chips.

The present invention also provides a three-dimensional stacking module where plural semiconductor assemblies each with a semiconductor device embedded in the cavity of the supporting board are stacked in back-to-back or face-to-back manner using interlayer dielectric between each two neighboring semiconductor assemblies and are electrically connected to one another through one ore more plated through-holes.

Unless specific descriptions or using the term "then" between steps or steps necessarily occurring in a certain order, the sequence of the above-mentioned steps is not limited to that set forth above and may be changed or reordered according to desired design.

The present invention has numerous advantages. The supporting board which contains a stiffener provides a flat and stable platform for forming the build-up circuitry and thus makes the manufacturing process easy to handle. The bump of the sacrificial carrier which defines a cavity area for device placement can only be separated from the dielectric layer by etching thus ensure a high manufacturing yield without unpredictable peeling or delamination concern. Furthermore, vast options of the built-in stiffener ranging from low coefficient of thermal expansion (CTE) materials like ceramics, to high thermal conductive materials like metal plate, to low cost materials like glass-fiber epoxy provide diversified solutions for various packaging designs. As a result, a semiconductor device can be mounted into a well-defined cavity, and the direct electrical connection without solder between the semiconductor device and the build-up circuitries advantageous to high I/O and high performance. The plated through-hole can provide vertical signal routing between two build-up circuitries or between the terminal and the build-up circuitry, thereby providing the semiconductor assembly with stacking capability.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which:

FIGS. 1A and 1B are cross-sectional views showing a bump and a flange in accordance with an embodiment of the present invention;

FIGS. 1C and 1D are top and bottom views, respectively, corresponding to FIG. 1B;

DETAILED DESCRIPTION OF THE PREFERRED EMBODIMENT

Figure 2A:
FIGS. 2A and 2B are cross-sectional views showing an adhesive in accordance with an embodiment of the present invention.

Hereafter, examples will be provided to illustrate the embodiments of the present invention. Other advantages and effects of the invention will become more apparent from the disclosure of the present invention. It should be noted that these accompanying figures are simplified. The quantity, shape and size of components shown in the figures may be modified according to practically conditions, and the arrangement of components may be more complex. Other various aspects also may be practiced or applied in the invention, and various modifications and variations can be made without departing from the spirit of the invention based on various concepts and applications.

Embodiment 1

FIGS. 1A and 1B are cross-sectional views showing a method of making a sacrificial carrier with a bump and a flange in accordance with an embodiment of the present invention, and FIGS. 1C and 1D are top and bottom views, respectively, corresponding to FIG. 1B.

FIG. 1A is a cross-sectional view of sacrificial carrier 10 which is a metal plate and includes opposing major surfaces 12 and 14. Sacrificial carrier 10 is illustrated as a copper plate with a thickness of 200 microns. Copper has good flexibility and low cost. Sacrificial carrier 10 can be various metals such as copper, aluminum, alloy 42, iron, nickel, silver, gold, tin, combinations thereof, and alloys thereof.

FIGS. 1B, 1C and 1D are cross-sectional, top and bottom views, respectively, of sacrificial carrier 10 with bump 16, flange 18 and cavity 20. Bump 16 and stamped cavity 20 are formed by mechanically stamping of sacrificial carrier 10. Thus, bump 16 is a stamped portion of sacrificial carrier 10 and flange 18 is an unstamped portion of sacrificial carrier 10.

Bump 16 is adjacent to and integral with flange 18 and extends from flange 18 in the downward direction. Bump 16 includes bent corners 22 and 24, tapered sidewall 26 and floor 28. Bent corners 22 and 24 are bent by the stamping operation. Bent corner 22 is adjacent to flange 18 and tapered sidewall 26 and bent corner 24 is adjacent to tapered sidewall 26 and floor 28. Tapered sidewall 26 extends outwardly as it extends in the upward direction and floor 28 extends laterally in lateral directions (such as left and right) orthogonal to the upward and downward directions. Thus, bump 16 has a cut-off pyramidal shape (resembling a frustum) in which its diameter decreases as it extends downwardly from flange 18 to floor 28 and increases as it extends upwardly from floor 28 to flange 18. Bump 16 has a height of 300 microns relative to flange 18, a dimension of 10.5 mm by 8.5 mm at flange 18 and a dimension of 10.25 mm by 8.25 mm at floor 28. Furthermore, bump 16 has an irregular thickness due to the stamping operation. For instance, tapered sidewall 26 is thinner than floor 28 since it is elongated by the stamping operation. Bump 16 is shown with a uniform thickness for convenience of illustration.

Flange 18 extends laterally from bump 16 in the lateral directions, is flat and has a thickness of 200 microns.

Stamped cavity 20 faces in the upward direction, extends into bump 16, is covered by bump 16 in the downward direction and has an entrance at flange 18. Stamped cavity 20 also conforms to the shape of bump 16. Thus, stamped cavity 20 has a cut-off pyramidal shape (resembling a frustum) in which its diameter decreases as it extends downwardly from its entrance at flange 18 to floor 28 and increases as it extends upwardly from floor 28 to its entrance at flange 18. Furthermore, stamped cavity 20 extends across most of bump 16 in the vertical and lateral directions and has a depth of 300 microns.

Figure 2B:
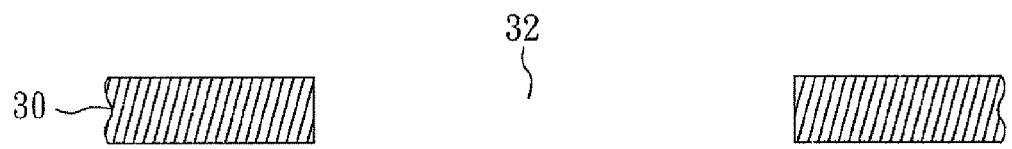
Figure 2C:
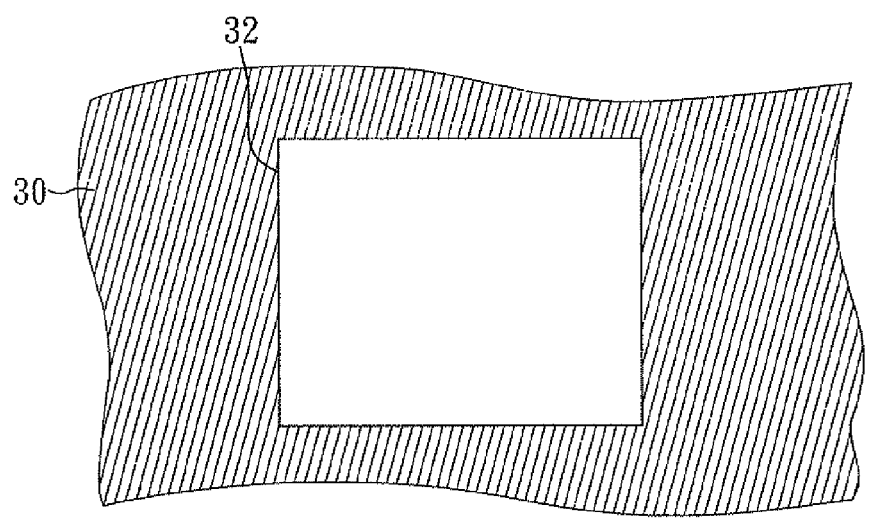
FIGS. 2C and 2D are top and bottom views, respectively, corresponding to FIG. 2B.
Figure 2D:
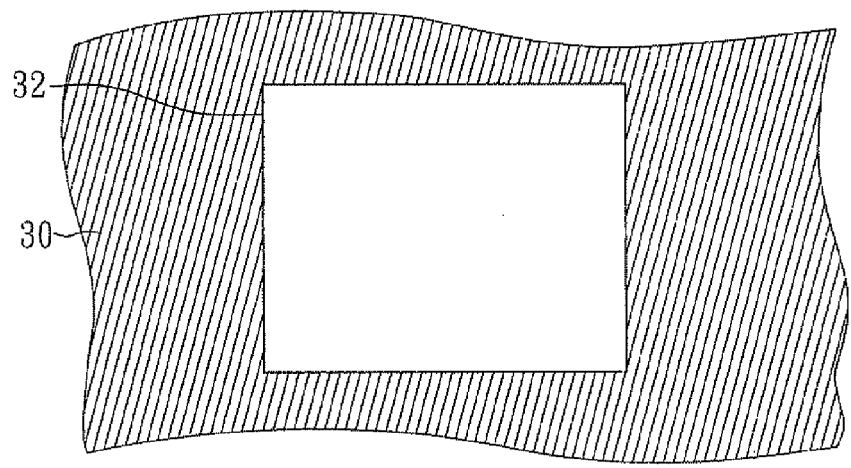

FIGS. 2A and 2B are cross-sectional views showing a method of making an adhesive in accordance with an embodiment of the present invention, and FIGS. 2C and 2D are top and bottom views, respectively, corresponding to FIG. 2B.

FIG. 2A is a cross-sectional view of adhesive 30. Adhesive 30 is illustrated as a prepreg with B-stage uncured epoxy provided as a non-solidified un-patterned sheet with a thickness of 150 microns.

Adhesive 30 can be various dielectric films or prepregs formed from numerous organic or inorganic electrical insulators. For instance, adhesive 30 can initially be a prepreg in which thermosetting epoxy in resin form impregnates a reinforcement and is partially cured to an intermediate stage. The epoxy can be FR-4 although other epoxies such as polyfunctional and bismaleimide triazine (BT) are suitable. For specific applications, cyanate esters, polyimide and PTFE are also suitable. The reinforcement can be E-glass although other reinforcements such as S-glass, D-glass, quartz, kevlar aramid and paper are suitable. The reinforcement can also be woven, non-woven or random microfiber. A filler such as silica (powdered fused quartz) can be added to the prepreg to improve thermal conductivity, thermal shock resistance and thermal expansion matching. Commercially available prepregs such as SPEEDBOARD C prepreg by W.L. Gore & Associates of Eau Claire, Wis. are suitable.

FIGS. 2B, 2C and 2D are cross-sectional, top and bottom views, respectively, of adhesive 30 with opening 32. Opening 32 is a window that extends through adhesive 30 and has a dimension of 10.55 mm by 8.55 mm. Opening 32 is formed by punching through the prepreg and can be formed by other techniques such as laser cutting.

Figure 3A:
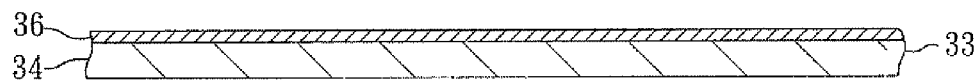
FIGS. 3A and 3B are cross-sectional views showing a stiffener including a substrate and a conductive layer in accordance with an embodiment of the present invention.
Figure 3B:
Figure 3C:
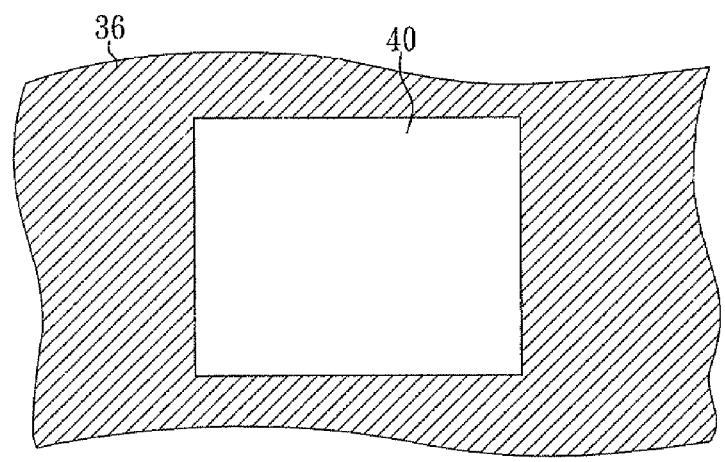
FIGS. 3C and 3D are top and bottom views, respectively, corresponding to FIG. 3B.
Figure 3D:
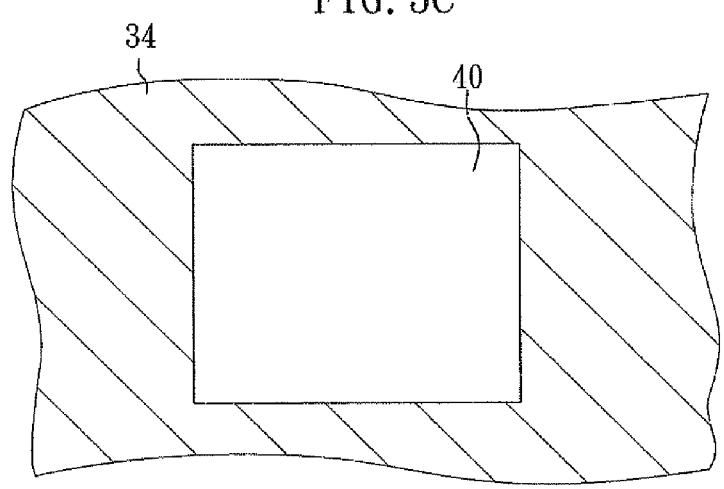

FIGS. 3A and 3B are cross-sectional views showing a method of making a stiffener in accordance with an embodiment of the present invention, and FIGS. 3C and 3D are top and bottom views, respectively, corresponding to FIG. 3B.

FIG. 3A is a cross-sectional view of stiffener 33 that includes substrate 34 and conductive layer 36. For instance, substrate 34 is a glass-epoxy material with a thickness of 150 microns and conductive layer 36 that contacts and extends above and is laminated to substrate 34 is an un-patterned copper sheet with a thickness of 30 microns.

FIGS. 3B, 3C and 3D are cross-sectional, top and bottom views, respectively, of stiffener 33 with an aperture 40. Aperture 40 is a window that extends through stiffener 33 and has a dimension of 10.55 mm by 8.55 mm. Aperture 40 is formed by punching through substrate 34 and conductive layer 36 and can be formed with other techniques such as laser cutting with or without wet etching. Thus, opening 32 and aperture 40 have the same dimension. Furthermore, opening 32 and aperture 40 can be formed in the same manner with the same punch at the same punching station.

Substrate 34 is illustrated as a single layer dielectric structure. Stiffener 33 can also be an electrical interconnect such as a multi-layer printed circuit board or a multi-layer ceramic board. Accordingly, stiffener 33 can include embedded circuitry.

Figure 4A:
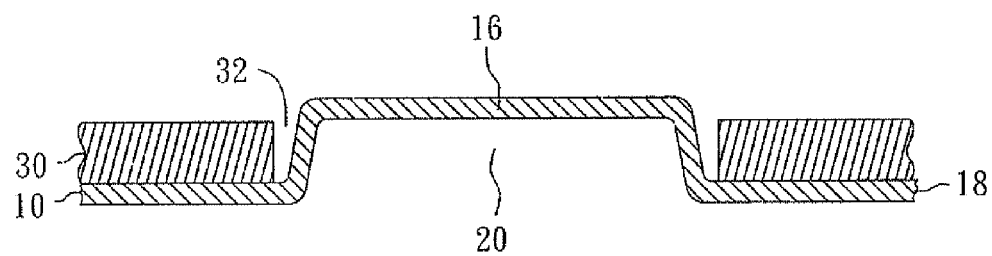
FIGS. 4A-4E are cross-sectional views showing a method of making a supporting board in accordance with an embodiment of the present invention.
Figure 4B:
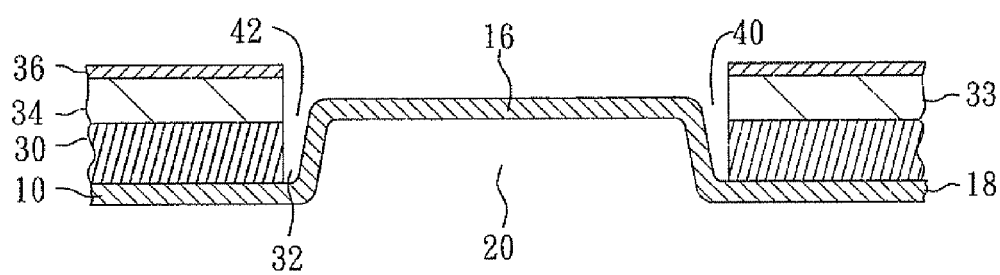

In FIGS. 4A and 4B the structure is inverted to a cavity-down position so that gravity assists with mounting adhesive 30 and stiffener 33 on flange 18 and in FIGS. 4C-5A the structure remains in the cavity-down position. Thereafter, in FIGS. 5B-5I the structure is inverted again to the cavity-up position as in FIGS. 1A-1D. Thus, stamped cavity 20 faces downward in FIGS. 4A-5A and upward in FIGS. 5B-5I. However, the relative orientation of the structure does not change. Stamped cavity 20 faces in the second vertical direction and is covered by bump 16 in the first vertical direction regardless of whether the structure is inverted, rotated or slanted. Likewise, bump 16 extends beyond stiffener 33 in the second vertical direction and extends from flange 18 in the first vertical direction regardless of whether the structure is inverted, rotated or slanted. Hence, the first and second vertical directions are oriented relative to the structure and remain opposite to one another and orthogonal to the lateral directions.

FIG. 4A is a cross-sectional view of the structure with adhesive 30 mounted on flange 18. Adhesive 30 is mounted by lowering it onto flange 18 as bump 16 is inserted into and through and upwards in opening 32. Adhesive 30 eventually contacts and rests on flange 18. Preferably, bump 16 is inserted into and extends through opening 32 without contacting adhesive 30 and is aligned with and centrally located within opening 32.

FIG. 4B is a cross-sectional view of the structure with stiffener 33 mounted on adhesive 30. Stiffener 33 is mounted by lowering it onto adhesive 30 as bump 16 is inserted into and upwards in aperture 40. Stiffener 33 eventually contacts and rests on adhesive 30.

Bump 16 is inserted into but not through aperture 40 without contacting stiffener 33 and is aligned with and centrally located within aperture 40. As a result, gap 42 is located in aperture 40 between bump 16 and stiffener 33. Gap 42 laterally surrounds bump 16 and is laterally surrounded by stiffener 33. In addition, opening 32 and aperture 40 are precisely aligned with one another and have the same dimension.

At this stage, stiffener 33 is mounted on and contacts and extends above adhesive 30. Bump 16 extends through opening 32 into aperture 40, is 30 microns below the top surface of conductive layer 36 and is exposed through aperture 40 in the upward direction. Adhesive 30 contacts and is sandwiched between flange 18 and substrate 34, contacts substrate 34 but is spaced from conductive layer 36 and remains a non-solidified prepreg with B-stage uncured epoxy, and gap 42 is filled with air.

Figure 4C:
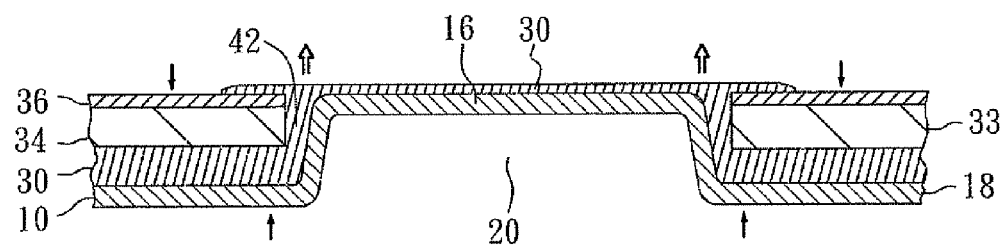

FIG. 4C is a cross-sectional view of the structure with adhesive 30 in gap 42. Adhesive 30 is flowed into gap 42 by applying heat and pressure. In this illustration, adhesive 30 is forced into gap 42 by applying downward pressure to conductive layer 36 and/or upward pressure to flange 18, thereby moving flange 18 and stiffener 33 towards one another and applying pressure to adhesive 30 while simultaneously applying heat to adhesive 30. Adhesive 30 becomes compliant enough under the heat and pressure to conform to virtually any shape. As a result, adhesive 30 sandwiched between flange 18 and stiffener 33 is compressed, forced out of its original shape and flows into and upward in gap 42. Flange 18 and stiffener 33 continue to move towards one another and adhesive 30 eventually fills gap 42. Moreover, adhesive 30 remains sandwiched between and continues to fill the reduced space between flange 18 and stiffener 33.

For instance, flange 18 and conductive layer 36 can be disposed between top and bottom platens (not shown) of a press. In addition, a top cull plate and top buffer paper (not shown) can be sandwiched between conductive layer 36 and the top platen, and a bottom cull plate and bottom buffer paper (not shown) can be sandwiched between flange 18 and the bottom platen. The stack includes the top platen, top cull plate, top buffer paper, substrate 34 and conductive layer 36, adhesive 30, flange 18, bottom buffer paper, bottom cull plate and bottom platen in descending order. Furthermore, the stack may be positioned on the bottom platen by tooling pins (not shown) that extend upward from the bottom platen through registration holes (not shown) in flange 18.

The platens are heated and move towards one another, thereby applying heat and pressure to adhesive 30. The cull plates disperse the heat from the platens so that it is more uniformly applied to flange 18 and stiffener 33 and thus adhesive 30, and the buffer papers disperse the pressure from the platens so that it is more uniformly applied to flange 18 and stiffener 33 and thus adhesive 30. Initially, stiffener 33 contacts and presses down on adhesive 30. As the platen motion and heat continue, adhesive 30 between flange 18 and stiffener 33 is compressed, melted and flows into and upward in gap 42 and across substrate 34 to conductive layer 36. For instance, the uncured epoxy is melted by the heat and the molten uncured epoxy is squeezed by the pressure into gap 42, however the reinforcement and the filler remain between flange 18 and stiffener 33. Adhesive 30 elevates more rapidly than bump 16 in aperture 40 and fills gap 42. Adhesive 30 also rises slightly above aperture 40 and overflows onto the top surfaces of bump 16 and conductive layer 36 before the platen motion stops. This may occur due to the prepreg being slightly thicker than necessary. As a result, adhesive 30 creates a thin coating on the top surfaces of bump 16 and conductive layer 36. The platen motion is eventually blocked by hump 16 and the platens become stationary but continue to apply heat to adhesive 30.

The upward flow of adhesive 30 in gap 42 is shown by the thick upward arrows, the upward motion of bump 16 and flange 18 relative to stiffener 33 is shown by the thin upward arrows, and the downward motion of stiffener 33 relative to bump 16 and flange 18 is shown by the thin downward arrows.

Figure 4D:
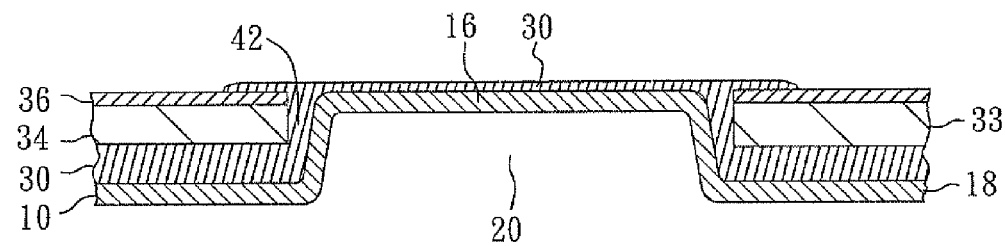

FIG. 4D is a cross-sectional view of the structure with adhesive 30 solidified.

For instance, the platens continue to clamp bump 16 and flange 18 and apply heat after the platen motion stops, thereby converting the 13-stage molten uncured epoxy into C-stage cured or hardened epoxy. Thus, the epoxy is cured in a manner similar to conventional multi-layer lamination. After the epoxy is cured, the platens move away from one another and the structure is released from the press.

Adhesive 30 as solidified provides a secure robust mechanical bond between bump 16 and stiffener 33 and between flange 18 and stiffener 33. Adhesive 30 can withstand normal operating pressure without distortion or damage and is only temporarily distorted under unusually high pressure. Furthermore, adhesive 30 can absorb thermal expansion mismatch between bump 16 and stiffener 33 and between flange 18 and stiffener 33.

At this stage, bump 16 and conductive layer 36 are essentially coplanar with one another and adhesive 30 and conductive layer 36 extend to a top surface that faces in the upward direction. For instance, adhesive 30 between flange 18 and stiffener 33 has a thickness of 120 microns which is 30 microns less than its initial thickness of 150 microns, bump 16 ascends 30 microns in aperture 40 and stiffener 33 descends 30 microns relative to bump 16. The 300 micron height of bump 16 is essentially the same as the combined height of conductive layer 36 (30 microns), substrate 34 (150 microns) and the underlying adhesive 30 (120 microns). Furthermore, bump 16 continues to be centrally located in opening 32 and aperture 40 and spaced from stiffener 33 and adhesive 30 fills the space between flange 18 and stiffener 33 and fills gap 42. Adhesive 30 extends across stiffener 33 in gap 42. That is, adhesive 30 in gap 42 extends in the upward and downward directions across the thickness of stiffener 33 at the outer sidewall of gap 42. Adhesive 30 also includes a thin top portion above gap 42 that contacts the top surfaces of bump 16 and conductive layer 36 and extends above bump 16 by 10 microns.

Figure 4E:
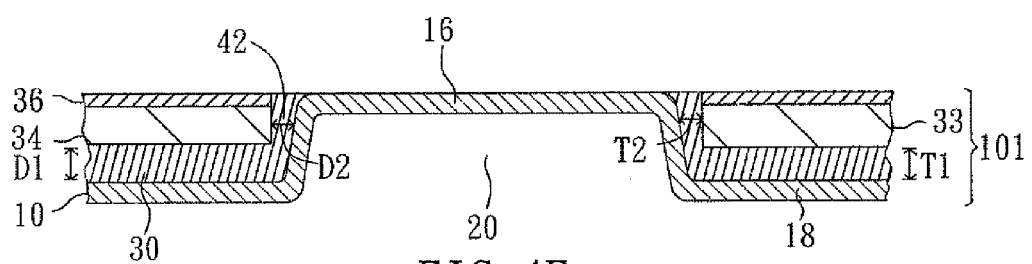

FIG. 4E is a cross-sectional view of the structure after upper portions of bump 16, adhesive 30 and conductive layer 36 are removed by grinding. For instance, a rotating diamond sand wheel and distilled water are applied to the top of the structure. Initially, the diamond sand wheel grinds only adhesive 30. As the grinding continues, adhesive 30 becomes thinner as its grinded surface migrates downwardly. Eventually the diamond sand wheel contacts bump 16 and conductive layer 36 (not necessarily at the same time), and as a result, begins to grind bump 16 and conductive layer 36 as well. As the grinding continues, bump 16, adhesive 30 and conductive layer 36 become thinner as their grinded surfaces migrate downwardly. The grinding continues until the desired thickness has been removed. Thereafter, the structure is rinsed in distilled water to remove contaminants.

The grinding removes a 20 micron thick upper portion of adhesive 30, a 10 micron thick upper portion of bump 16 and a 10 micron thick upper portion of conductive layer 36. The decreased thickness does not appreciably affect bump 16 or adhesive 30. However, it substantially reduces the thickness of conductive layer 36 from 30 microns to 20 microns. After the grinding, bump 16, adhesive 30 and conductive layer 36 are coplanar with one another at a smoothed lapped lateral top surface that is above substrate 34 and faces in the upward direction.

At this stage, as shown in FIG. 4E, supporting board 101 includes sacrificial carrier 10, adhesive 30 and stiffener 33. Sacrificial carrier 10 includes bump 16 and flange 18. Bump 16 is adjacent to flange 18 at bent corner 22, extends from flange 18 in the upward direction and is integral with flange 18. Bump 16 extends into and remains centrally located within opening 32 and aperture 40, and is coplanar at its top with an adjacent portion of adhesive 30. Bump 16 is spaced from stiffener 33 and retains its cut-off pyramidal shape in which its dimension increases as it extends downwardly.

Stamped cavity 20 faces in the downward direction, extends into remains centrally located within bump 16, opening 32 and aperture 40 and is covered by bump 16 in the upward direction. Stamped cavity 20 conforms to the shape of bump 16, extends across most of bump 16 in the vertical and lateral directions and retains its cut-off pyramidal shape in which its dimension decreases as it extends upwardly from its entrance at flange 18.

Flange 18 extends laterally from bump 16, extends below adhesive 30, stiffener 33, opening 32 and aperture 40, contacts adhesive 30 and is spaced from stiffener 33.

Adhesive 30 contacts and is sandwiched between and fills the space between bump 16 and stiffener 33 in gap 42 and contacts stiffener 33 and flange 18 outside gap 42. Adhesive 30 covers and surrounds tapered sidewall 26 of bump 16 in the lateral directions, extends laterally from bump 16 to peripheral edges of the assembly and is solidified. Accordingly, adhesive 30 has first thickness T1 where it is adjacent to flange 18 and second thickness T2 where it is adjacent to bump 16 that is different from first thickness T1. That is, distance D1 in the vertical directions between flange 18 and stiffener 33 is different from distance D2 in the lateral directions between bump 16 and stiffener 33. Furthermore, as adhesive 30 extends away from flange 18 into gap 42 between bump 16 and stiffener 33, adhesive 30 can have an increasing thickness where it is adjacent to bump 16 owing to that bump 16 has an increasing dimension as it extends towards flange 18.

Supporting board 101 with multiple bumps can be accomplished by stamping sacrificial carrier 10 to include additional bumps 16, adjusting adhesive 30 to include additional openings 32 and adjusting stiffener 33 to include additional apertures 40.

FIGS. 5A-5I are cross-sectional views showing a method of making a semiconductor assembly that includes a supporting board, a semiconductor device, and a build-up circuitry electrically connected to the semiconductor device in accordance with an embodiment of the present invention.

Figure 5A:
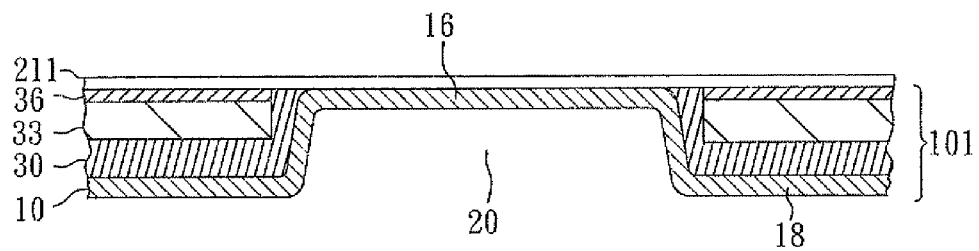
FIGS. 5A-5I are cross-sectional views showing a method of making a semiconductor device that includes a supporting board, a semiconductor device, and a build-up circuitry in accordance with an embodiment of the present invention.
Figure 5B:
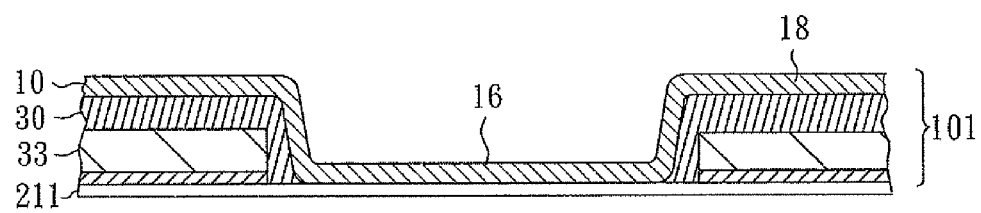
Figure 5C:
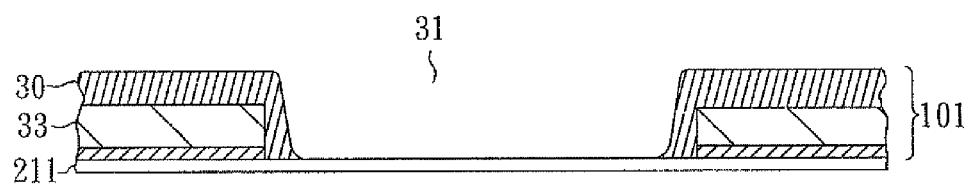
Figure 5D:
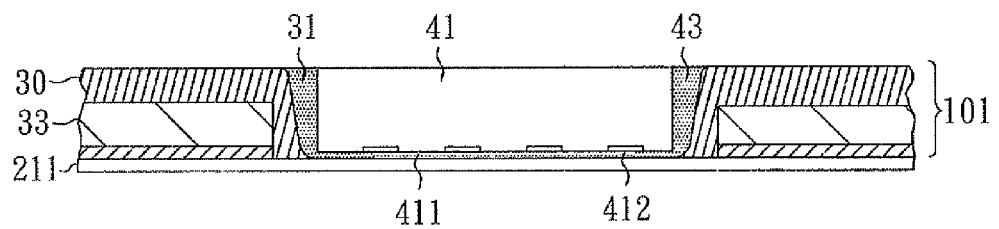
Figure 5E:
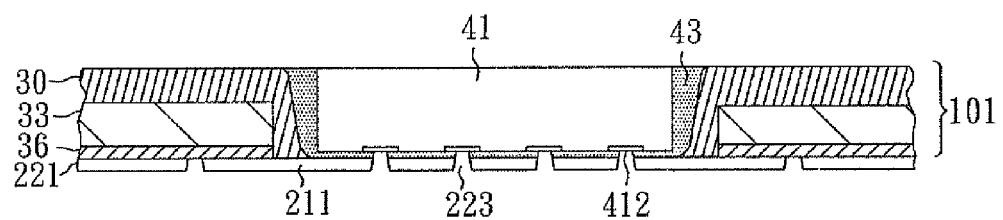
Figure 5F:
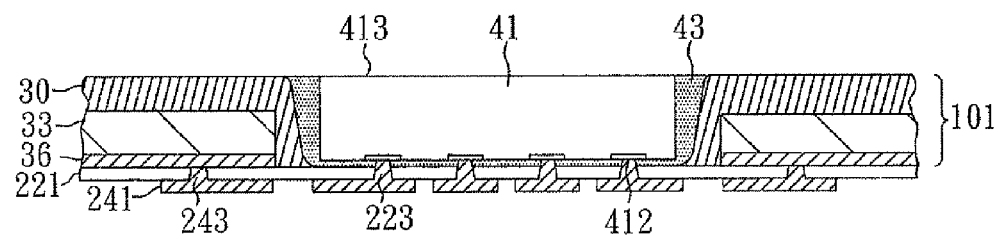
Figure 5G:
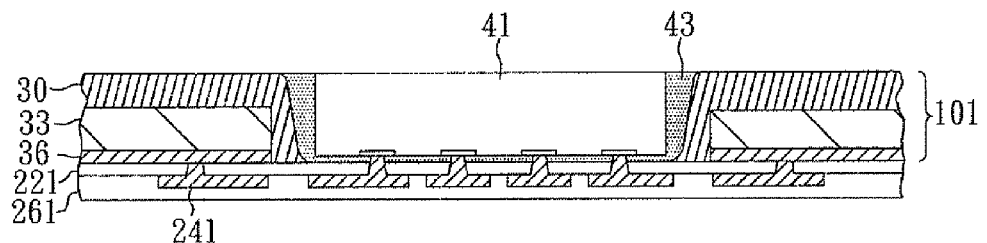
Figure 5H:
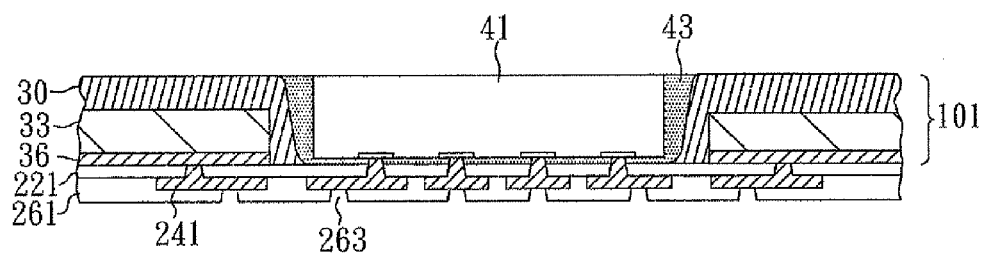
Figure 5I:
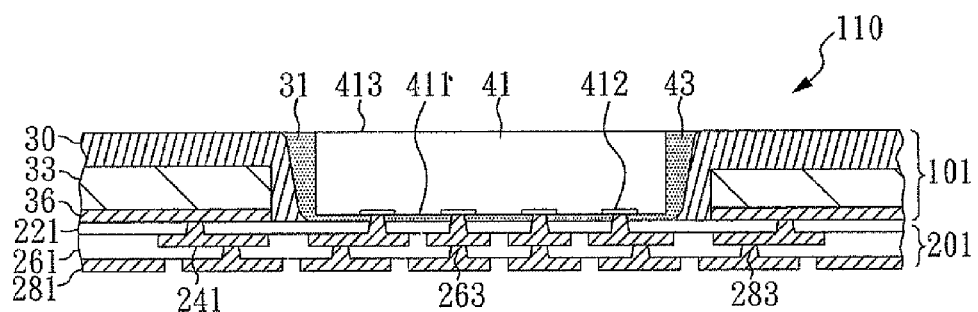

As shown in FIG. 5I, semiconductor assembly 110 includes supporting board 101, semiconductor device 41, first build-up circuitry 201 and die attach 43. Supporting board 101 includes adhesive 30 and stiffener 33. Semiconductor device 41 includes active surface 411, inactive surface 413 opposite to active surface 411, and contact pads 412 at active surface 411 and extends into cavity 31 of supporting board 101. First build-up circuitry 201 is electrically connected to semiconductor device 41 and includes first insulating layer 221, first conductive traces 241, second dielectric layer 261 and second conductive traces 281.

FIG. 5A is a cross-sectional view of the structure with dielectric layer 211, such as epoxy resin, glass-epoxy, polyimide and the like, disposed on bump 16, adhesive 30 and stiffener 33. Dielectric layer 211 may be deposited by numerous techniques including film lamination, roll coating, spin coating and spray-on deposition. Dielectric layer 211 may be treated by plasma etching or coated with an adhesion promoter (not shown) to promote adhesion. Dielectric layer 211 has a thickness of 50 microns.

FIG. 5B is a cross-sectional view of the structure after it is inverted from FIG. 5A.

FIG. 5C is a cross-sectional view of the structure with dielectric layer 211 exposed from cavity 31 in the upward direction. Cavity 31 is defined in adhesive 30 by removing bump 16 and flange 18 and has a cut-off pyramidal shape in which its dimension increases as it extends upwardly, thereby exposing dielectric layer 211 from cavity 31. Bump 16 and flange 18 can be removed by numerous techniques including wet chemical etching using acidic solution (e.g., Ferric Chloride, Copper Sulfate solutions), or alkaline solution (e.g., Ammonia solution), electro-chemical etching, or mechanical process such as a drill or end mill followed by chemical etching. At this stage, as shown in FIG. 5C, supporting board 101 includes adhesive 30 and stiffener 33, and cavity 31 is centrally located within opening 32 and aperture 40 and has a closed end in the downward direction and an open end in the upward direction. In this illustration, sacrificial carrier 10 is entirely removed. However, in some embodiments, selected portions of flange 18 may be reserved as a supporting platform for a heat sink attached thereon. Furthermore, supporting board 101 may include multiple cavities 31 by applying sacrificial carrier 10 with multiple bumps 16 and thus defining multiple cavities 31 in adhesive 30.

FIG. 5D is a cross-sectional view of the structure with semiconductor device 41 mounted on dielectric layer 211 by die attach 43. Semiconductor device 41, which includes contact pads 412 on active surface 411, is mounted by lowering it into cavity 31, and eventually rests on dielectric layer 211 by die attach 43. Die attach 43 fills the remaining space of cavity 31 and contacts and is sandwiched between dielectric layer 211 and semiconductor device 41 and between adhesive 30 and semiconductor device 41.

FIG. 5E is a cross-sectional view of the structure showing first via openings 223 formed through dielectric layer 211 and die attach 43 to expose contact pads 412 of semiconductor device 41 and selected portions of conductive layer 36. First via openings 223 may be formed by numerous techniques including laser drilling, plasma etching and photolithography. Laser drilling can be enhanced by a pulsed laser. Alternatively, a scanning laser beam with a metal mask can be used. First via openings 223 have a diameter of 50 microns, and dielectric layer 211 is considered first insulating layer 221 of build-up circuitry.

Referring now to FIG. 5F, first conductive traces 241 are formed on first insulating layer 221. First conductive traces 241 extend from first insulating layer 221 in the downward direction, extend laterally on first insulating layer 221 and extend into first via openings 223 in the upward direction to form first conductive vias 243 in electrical contact with contact pads 412 of semiconductor device 41 and conductive layer 36 of stiffener 33. First conductive traces 241 can be deposited by numerous techniques including electroplating, electroless plating, evaporating, sputtering, and their combinations as a single layer or multiple layers.

For instance, first conductive traces 241 are deposited as a first plated layer by first dipping the structure in an activator solution to render first insulating layer 221 catalytic to electroless copper, then a thin copper layer is electrolessly plated to serve as the seeding layer before a second copper layer is electroplated on the seeding layer to a desirable thickness. Alternatively, the seeding layer can be formed by sputtering a thin film such as titanium/copper onto first insulating layer 221 as well as into first via openings 223 before depositing the electroplated copper layer on the seeding layer. Once the desired thickness is achieved, the first plated layer (i.e. the combination of the electroplated copper layer and the seeding layer) is patterned to form first conductive traces 241. First conductive traces 241 can be patterned by numerous techniques including wet etching, electro-chemical etching, laser-assist etching, and their combinations with an etch mask (not shown) thereon that defines first conductive traces 241.

First conductive traces 241 can provide horizontal signal routing in both the X and Y directions and vertical (top to bottom) routing through first via openings 223 and serve as electrical connections for contact pads 412 and conductive layer 36.

FIG. 5G is a cross-sectional view of the structure showing second insulating layer 261 disposed on first conductive traces 241 and first insulating layer 221. Like first insulating layer 221, second insulating layer 261 can be epoxy resin, glass-epoxy, polyimide and the like deposited by numerous techniques including film lamination, spin coating, roll coating, and spray-on deposition and has a thickness of 50 microns. Preferably, first insulating layer 221 and second insulating layer 261 are the same material with the same thickness formed in the same manner.

FIG. 5H is a cross-sectional view of the structure showing second via openings 263 formed through second insulating layer 261 to expose selected portions of first conductive traces 241. Like first via openings 223, second via openings 263 can be formed by numerous techniques including laser drilling, plasma etching and photolithography and have a diameter of 50 microns. Preferably, first via openings 223 and second via openings 263 are formed in the same manner and have the same size.

Referring now to FIG. 5I, second conductive traces 281 are formed on second insulating layer 261. Second conductive traces 281 extend from second insulating layer 261 in the downward direction, extend laterally on second insulating layer 261 and extend into second via openings 263 in the upward direction to form second conductive vias 283 in electrical contact with first conductive traces 241.

Second conductive traces 281 can be deposited as a second plated layer by numerous techniques including electrolytic plating, electroless plating, sputtering, and their combinations and then patterned by numerous techniques including wet etching, electro-chemical etching, laser-assist etching, and their combinations with an etch mask (not shown) thereon that defines second conductive traces 281. Preferably, first conductive traces 241 and second conductive traces 281 are the same material with the same thickness formed in the same manner.

Accordingly, as shown in FIG. 5I, semiconductor assembly 110 is accomplished and includes supporting board 101, semiconductor device 41, die attach 43 and first build-up circuitry 201. In this illustration, first build-up circuitry 201 includes first insulating layer 221, first conductive traces 241, second insulating layer 261 and second conductive traces 281. First conductive traces 241 of first build-up circuitry 201 directly contact pads 412 of semiconductor device 41, and thus the electrical connection between semiconductor device 41 and first build-up circuitry 201 is devoid of solder. Furthermore, first build-up circuitry 201 may include additional interconnect layers (i.e. a third dielectric layer with third via openings, third conductive traces and so on), if desired.

Adhesive 30 is solidified, laterally covers and surrounds and conformally coats a sidewall of cavity 31, extends laterally from cavity 31 to peripheral edges of semiconductor assembly 110, and covers and contacts stiffener 33 in the upward direction. Adhesive 30 has a first thickness where it is adjacent to the sidewall of cavity 31 and a second thickness where it covers stiffener 33 in the upward direction that is different from the first thickness. The mechanical rigidity of cured adhesive 30 and stiffener 33 can provide mechanical support for first build-up circuitry 201 even removing sacrificial carrier 10.

Embodiment 2

FIGS. 6A-6J are cross-sectional views showing a method of making a semiconductor assembly with plated through-holes connected to inner pads of the supporting board in accordance with another embodiment of the present invention.

For purposes of brevity, any description in Embodiment 1 is incorporated herein insofar as the same is applicable, and the same description need not be repeated.

Figure 6A:
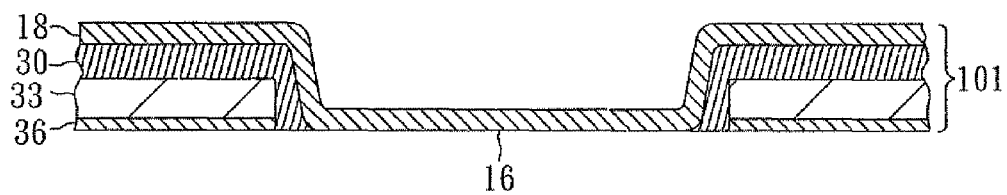
FIGS. 6A-6J are cross-sectional views showing a method of making a semiconductor device with plated through-holes that extend from terminals to inner pads in accordance with another embodiment of the present invention.

FIG. 6A is a cross-sectional view of supporting board 101, which is manufactured by the steps shown in FIGS. 1A-4E.

Figure 6B:
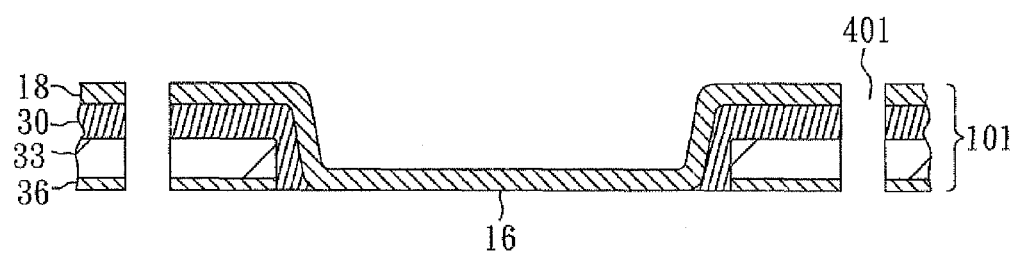

FIG. 6B is a cross-sectional view of the structure with through-holes 401. Through-holes 401 extend through flange 18, adhesive 30 and stiffener 33 in the vertical direction. Through-holes 401 are formed by mechanical drilling and can be formed by other techniques such as laser drilling and plasma etching with or without wet etching.

Figure 6C:
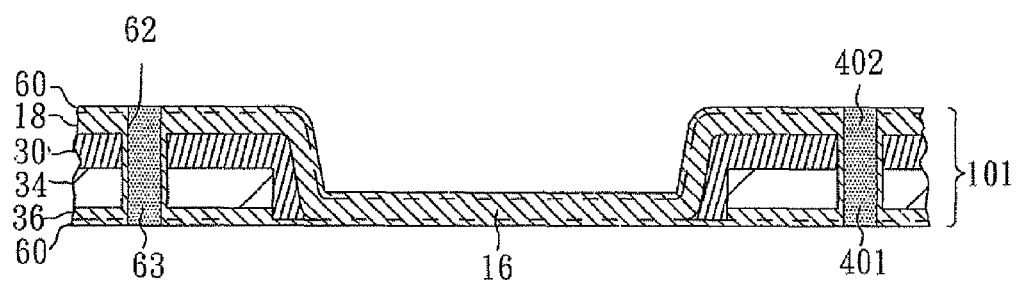

FIG. 6C is a cross-sectional view of the structure with first plated layer 60 outside through-holes 401 and connecting layer 62 and insulative filler 63 in through-holes 401. First plated layer 60 is an un-patterned copper layer that covers supporting board 101 in the upward and downward directions and contacts bump 16, flange 18, adhesive 30 and conductive layer 36.

Also shown in FIG. 6C is connecting layer 62 deposited in the through-holes 401 to provide plated through-holes 402. Connecting layer 62 is a hollow tube that covers the sidewall of through-holes 401 in lateral directions and extends vertically to electrically connect flange 18 and first plated layer 60 thereon to conductive layer 36 and first plated layer 60 thereon, and insulative filler 63 fills the remaining space in through-holes 401. Alternatively, connecting layer 62 can fill through-hole 401 in which case plated through-hole 402 is a metal post and there is no space for an insulative filler in through-hole 401.

Preferably, first plated layer 60 and connecting layer 62 are the same material deposited simultaneously in the same manner and have the same thickness.

Bump 16, flange 18, first plated layer 60, conductive layer 36 and connecting layer 62 are shown as a single layer for convenience of illustration. The boundary (shown in phantom) between the metal layers may be difficult or impossible to detect since copper is plated on copper. However, the boundary between adhesive 30 and first plated layer 60, between adhesive 30 and connecting layer 62, and between substrate 34 and connecting layer 62 is clear.

Figure 6D:
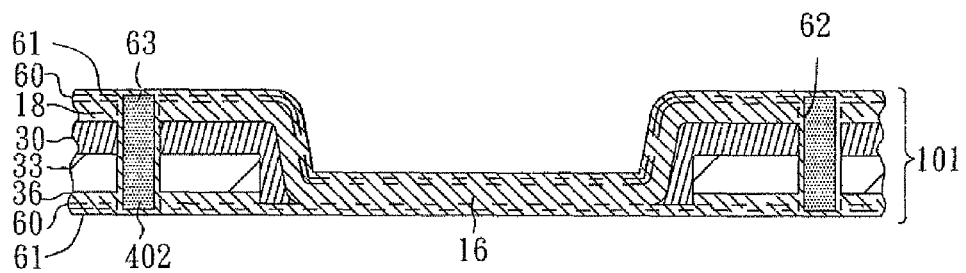

FIG. 6D is a cross-sectional view of the structure with second plated layer 61 deposited on first plated layer 60 and insulative filler 63. Second plated layer 61 is an un-patterned copper layer that covers and extends from first plated layer 60 and insulative filler 63 in the upward and downward directions.

For convenience of illustration, bump 16, flange 18, first plated layer 60, second plated layer 61, conductive layer 36 and connecting layer 62 are shown as a single layer due to that the boundary (shown in phantom) between the metal layers may be difficult or impossible to detect since copper is plated on copper.

Figure 6E:
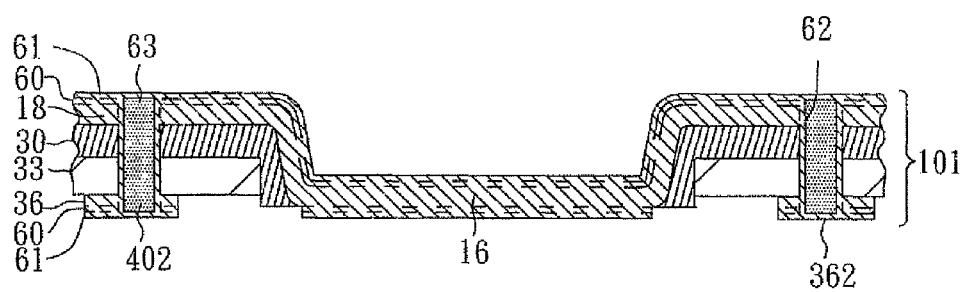

FIG. 6E is a cross-sectional view of the structure showing inner pads 362 formed on plated through-holes 402 by selective patterning of conductive layer 36 as well as first metal layer 60 and second metal layer 61 thereon via photolithography and wet etching. Inner pads 362 are adjacent to and electrically connected to plated through-holes 402, extend laterally from plated through-holes 402 and cover plated through-holes 402 in the downward direction. Inner pads 362 have combined thickness of conductive layer 36, first plated layer 60 and second plated layer 61.

At this stage, as shown in FIG. 6E, supporting board 101 includes sacrificial carrier 10, first plated layer 60, second plated layer 61, adhesive 30, stiffener 33 and inner pads 362. Plated through-holes 402 extend through supporting board 101 in vertical directions to provide an electrical connection between inner pad 362 and flange 18 as well as first and second plated layer 60, 61 thereon.

Figure 6F:
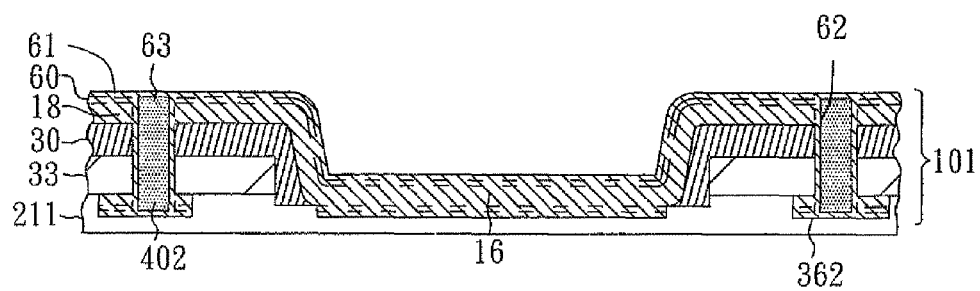

FIG. 6F is a cross-sectional view of the structure provided with dielectric layer 211. Dielectric layer 211 covers bump 16, adhesive 30, stiffener 33 and inner pad 362 in the downward direction.

Figure 6G:
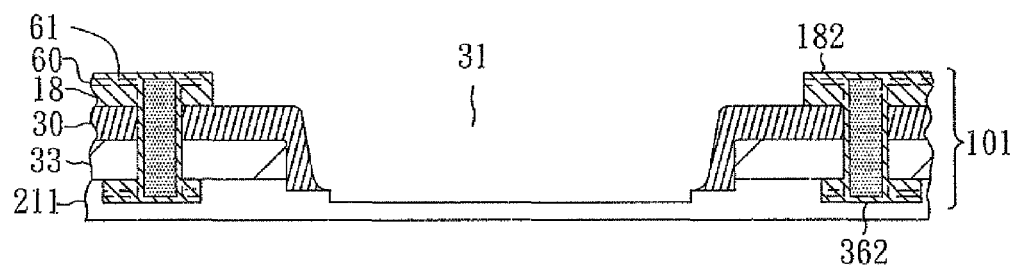

FIG. 6G is a cross-sectional view of the structure with dielectric layer 211 exposed from cavity 31. Cavity 31 is defined in adhesive 30 by removing bump 16 and a selected portion of flange 18 as well as first and second plated layers 60, 61 thereon, thereby exposing dielectric layer 211 from cavity 31 and defining terminals 182. Terminal 182 has a combined thickness of flange 18, first plated layer 60 and second plated layer 61.

At this stage, as shown in FIG. 6G, supporting board 101 includes terminals 182, adhesive 30, stiffener 33 and inner pads 362. Plated through-holes 402 extend through supporting board 101 in vertical directions to provide an electrical connection between terminal 182 and inner pad 362.

Figure 6H:
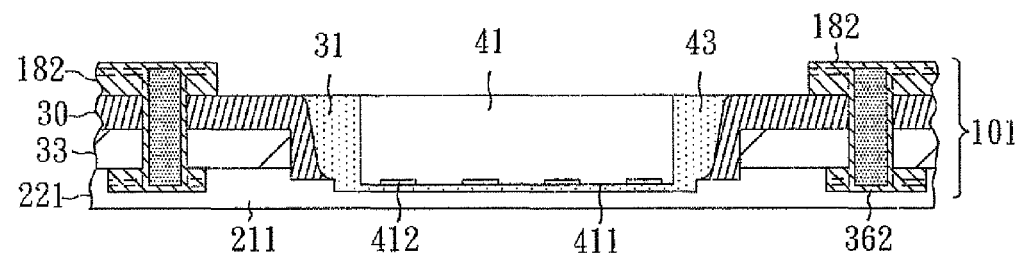

FIG. 6H is a cross-sectional view of the structure with semiconductor device 41 mounted on dielectric layer 211 by die attach 43. Semiconductor device 41, which includes contact pads 412 on active surface 411, is mounted by lowering it into cavity 31, and eventually rests on dielectric layer 211 by die attach 43. Die attach 43 fills the remaining space of cavity 31 and contacts and is sandwiched between dielectric layer 211 and semiconductor device 41 and between adhesive 30 and semiconductor device 41. Accordingly, semiconductor device 41 is bonded to dielectric layer 211 that is considered first insulating layer 221 of build-up circuitry.

Figure 6I:
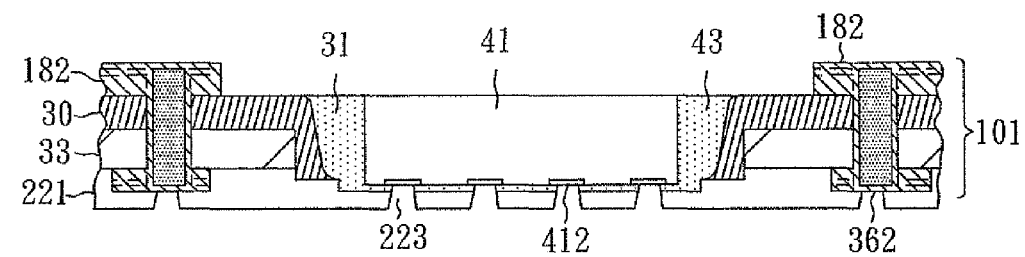

FIG. 6I is a cross-sectional view of the structure provided with first via openings 223. First via openings 223 extend through first insulating layer 221 and die attach 43 to expose contact pads 412 of semiconductor device 41 and inner pad 362.

Figure 6J:
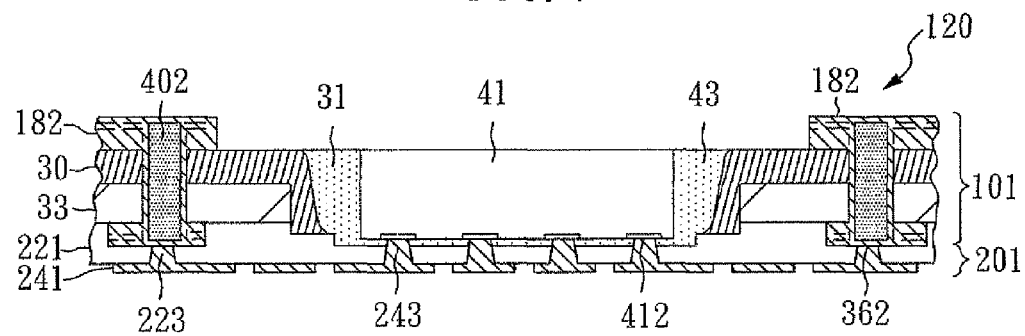

Referring now to FIG. 6J, first conductive traces 241 are formed on first insulating layer 221. First conductive traces 241 extend from first insulating layer 221 in the downward direction, extend laterally on first insulating layer 221 and extend through first via openings 223 in the upward direction to form conductive vias 243 in contact with contact pads 412 and inner pads 362.

Accordingly, as shown in FIG. 6J, semiconductor assembly 120 is accomplished and includes supporting board 101, semiconductor device 41, die attach 43, first build-up circuitry 201 and plated through-hole 402. In this illustration, supporting board 101 includes adhesive 30, stiffener 33, inner pads 362 and terminals 182, and first build-up circuitry 201 includes first insulating layer 221 and first conductive traces 241. Terminals 182 extend from adhesive 30 in the upward direction and are adjacent to and electrically connected to plated through-holes 402. Inner pads 362 extend from stiffener 33 in the downward direction and are adjacent to and electrically connected to plated through-holes 402 and first conductive traces 241. Plated through-holes 402 extend from terminals 182 to inner pads 362 through adhesive 30 and stiffener 33 in an electrically conductive path between first build-up circuitry 201 and terminals 182.

Embodiment 3

FIGS. 7A-7I are cross-sectional views showing a method of making a semiconductor assembly with plated through-holes connected to an inner conductive layer of the build-up circuitry in accordance with yet another embodiment of the present invention.

For purposes of brevity, any description in above Embodiments is incorporated herein insofar as the same is applicable, and the same description need not be repeated.

Figure 7A:
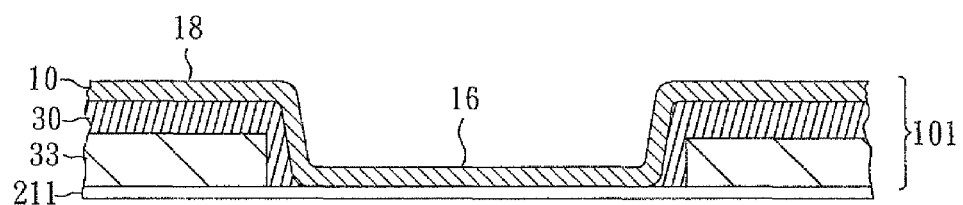
FIGS. 7A-7I are cross-sectional views showing a method of making a semiconductor device with plated through-holes that extend from terminals to an inner conductive layer of build-up circuitry in accordance with yet another embodiment of the present invention.

FIG. 7A is a cross-sectional view of the structure, which is manufactured by the steps shown in FIGS. 1A-5A. Supporting board 101 and dielectric layer 211 illustrated in this embodiment are the same as those mentioned in Embodiment 1, except that stiffener 33 includes no conductive layer thereon.

Figure 7B:
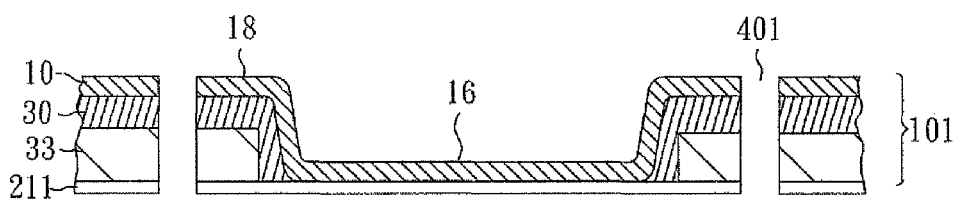

FIG. 7B is a cross-sectional view of the structure provided with through-holes 401. Through-holes 401 extend through dielectric layer 211, stiffener 33, adhesive 30 and flange 18 in the vertical directions.

Figure 7C:
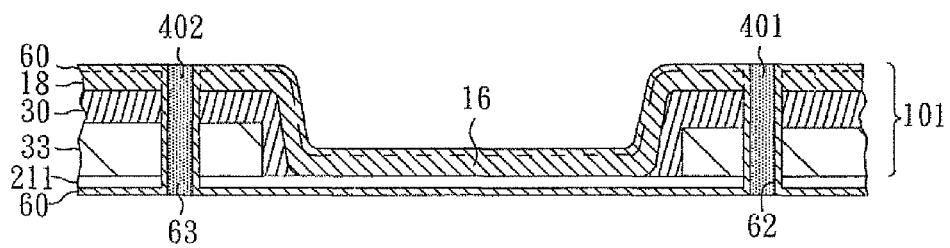

FIG. 7C is a cross-sectional view of the structure with first plated layer 60 outside through-holes 401 and connecting layer 62 and insulative filler 63 in through-holes 401. First plated layer 60 covers and extends from bump 16 and flange 18 in the upward direction, and also covers and extends from dielectric layer 211 in the downward direction.

Also shown in FIG. 7C is connecting layer 62 deposited in the through-holes 401 to provide plated through-holes 402. Connecting layer 62 is a hollow tube that covers the sidewall of through-hole 401 in lateral directions and extends vertically to electrically connect flange 18 and first plated layer 60 thereon to first plated layer 60 on dielectric layer 211, and insulative filler 63 fills the remaining space in through-holes 401. Alternatively, connecting layer 62 can fill through-hole 401 in which case plated, through-hole 402 is a metal post and there is no space for an insulative filler in through-hole 401.

Preferably, first plated layer 60 and connecting layer 62 are the same material deposited simultaneously in the same manner and have the same thickness.

Bump 16, flange 18, first plated layer 60 and connecting layer 62 are shown as a single layer for convenience of illustration. The boundary (shown in phantom) between the metal layers may be difficult or impossible to detect since copper is plated on copper. However, the boundary between dielectric layer 211 and first plated layer 60, between adhesive 30 and connecting layer 62, and between stiffener 33 and connecting layer 62 is clear.

Figure 7D:
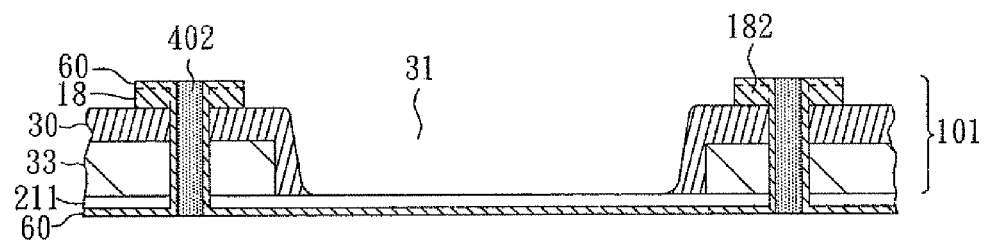

FIG. 7D is a cross-sectional view of the structure with dielectric layer 211 exposed from cavity 31. Cavity 31 is defined in adhesive 30 by removing bump 16 and a selected portion of flange 18 as well as first plated layers 60 thereon, thereby exposing dielectric layer 211 from cavity 31 and defining terminals 182. Terminal 182 has a combined thickness of flange 18 and first plated layer 60.

At this stage, as shown in FIG. 7D, supporting board 101 includes terminals 182, adhesive 30 and stiffener 33. Plated through-holes 402 extend through supporting board 101 and dielectric layer 211 in vertical directions to provide an electrical connection between terminal 182 and first plated layer 60 on dielectric layer 211.

Figure 7E:
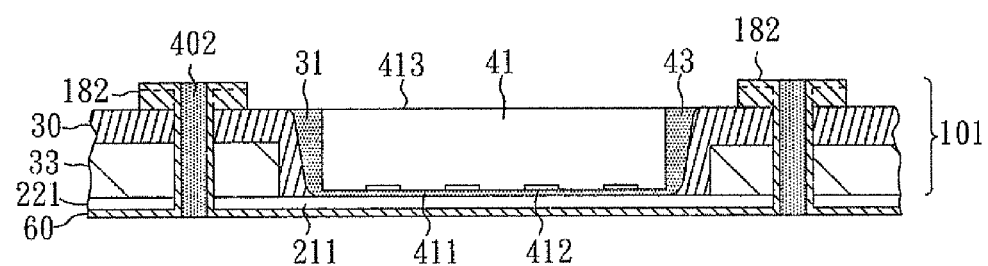

FIG. 7E is a cross-sectional view of the structure with semiconductor device 41 mounted on dielectric layer 211 by die attach 43. Semiconductor device 41, which includes contact pads 412 on active surface 411, is mounted by lowering it into cavity 31, and eventually rests on dielectric layer 211 by die attach 43. Die attach 43 fills the remaining space of cavity 31 and contacts and is sandwiched between dielectric layer 211 and semiconductor device 41 and between adhesive 30 and semiconductor device 41. Accordingly, semiconductor device 41 is bonded to dielectric layer 211 that is considered first insulating layer 221 of build-up circuitry.

Figure 7F:
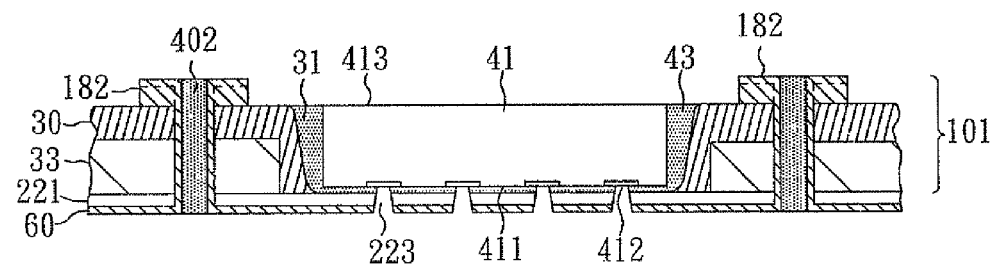

FIG. 7F is a cross-sectional view of the structure provided with first via openings 223. First via openings 223 extend through first insulating layer 221 and die attach 43 to expose contact pads 412 of semiconductor device 41.

Figure 7G:
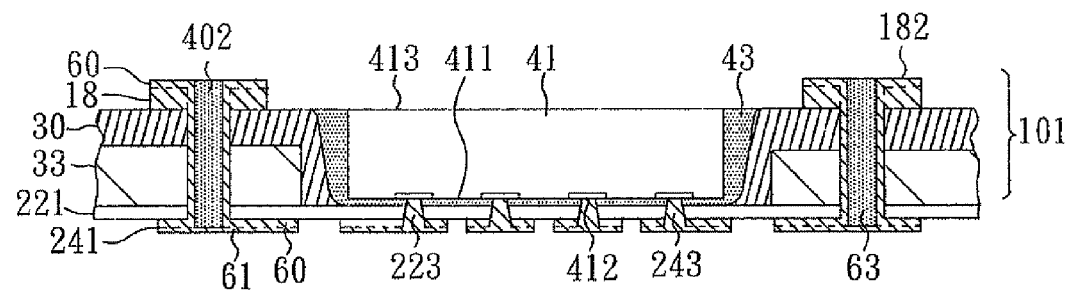

FIG. 7G is a cross-sectional view of the structure showing first conductive traces 241 formed on first insulating layer 221 by depositing and patterning metal. First conductive traces 241 are formed by depositing second plated layer 61 on first plated layer 60 and insulative filler 63 at the lateral bottom surface and into first via openings 223 and then patterning first plated layer 60 and second plated layer 61 thereon. Second plated layer 61 covers and extends from first plated layer 61 and insulative filler 63 in the downward direction and extends into first via openings 223 in the upward direction to form first conductive vias 243 in contact with contact pads 412 of semiconductor device 41. Accordingly, first conductive traces 241 can be electrically connected to semiconductor device 41 through first conductive vias 243 and electrically connected to terminals 182 through plated through-holes 402.

First plated layer 60 and second plated layer 61 thereon are shown as a single layer for convenience of illustration. The boundary (shown in phantom) between the metal layers may be difficult or impossible to detect since copper is plated on copper. However, the boundary between second plated layer 61 and first insulating layer 221 and between second plated layer 61 and insulative filler 63 is clear.

Figure 7H:
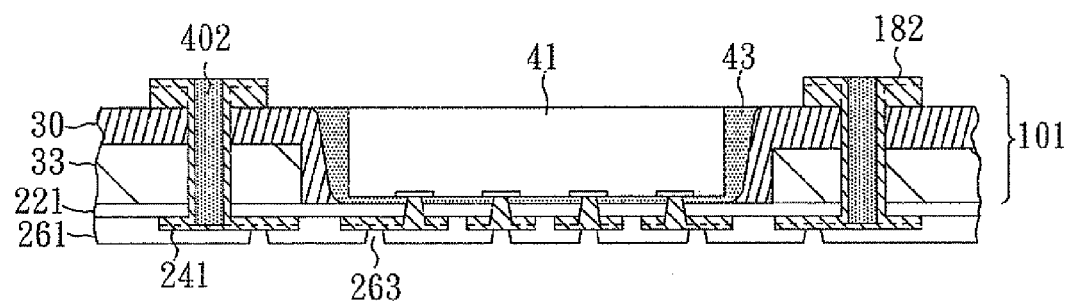

FIG. 7H is a cross-sectional view of the structure showing second insulating layer 261 with second via openings 263. Second insulating layer 261 is disposed on first conductive traces 241 and first insulating layer 221, and second via openings 263 extend through second insulating layer 261 and expose selected portions of first conductive traces 241.

Figure 7I:
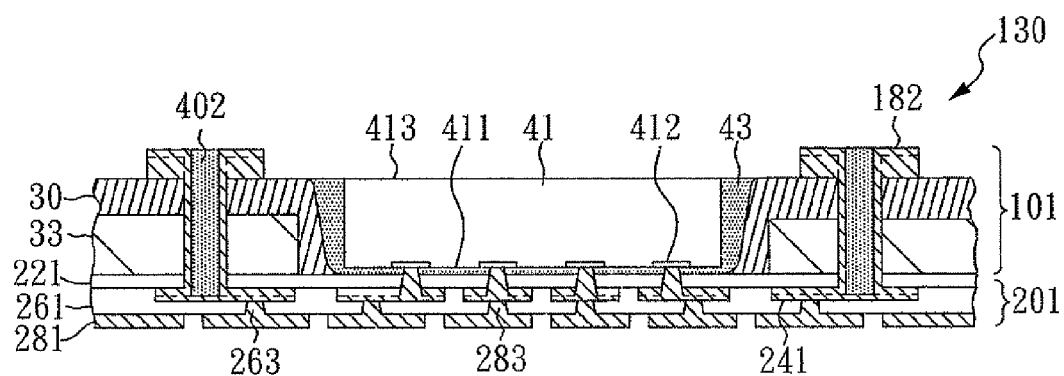

FIG. 7I is the cross-sectional view of the structure showing second conductive traces 281 formed on second insulating layer 261. Second conductive traces 281 extend from second insulating layer 261 in the downward direction, extend laterally on second insulating layer 261 and extend into second via openings 263 in the upward direction to form second conductive vias 283 in electrical contact with the first conductive traces 241.

Accordingly, as shown in FIG. 7I, semiconductor assembly 130 is accomplished and includes supporting board 101, semiconductor device 41, die attach 43, first build-up circuitry 201 and plated through-holes 402. In this illustration, supporting board 101 includes adhesive 30, stiffener 33, and terminals 182, and first build-up circuitry 201 includes first insulating layer 221, first conductive traces 241, second insulating layer 261 and second conductive traces 281. Terminals 182 extend from adhesive 30 in the upward direction, are spaced from first build-up circuitry 201 by adhesive 30 and stiffener 33, and are adjacent to and is electrically connected to plated through-holes 402. Plated through-holes 402 are shared by supporting board 101 and first build-up circuitry 201 and extend from terminals 182 to first conductive traces 241 through adhesive 30, stiffener 33 and first insulating layer 221 in an electrically conductive path between first build-up circuitry 201 and terminals 182.

Embodiment 4

FIGS. 8A-8J are cross-sectional views showing a method of making a three-dimensional semiconductor assembly with dual build-up circuitries in accordance with still another embodiment of the present invention.

For purposes of brevity, any description in above Embodiments is incorporated herein insofar as the same is applicable, and the same description need not be repeated.

Figure 8A:
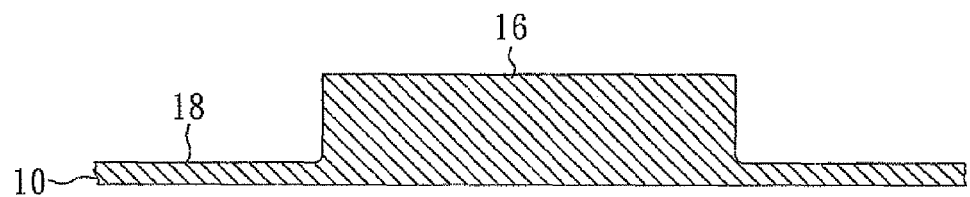
FIGS. 8A-8J are cross-sectional views showing a method of making a three-dimensional semiconductor assembly with a supporting board, an embedded semiconductor device, dual build-up circuitries and plated through-holes in accordance with still another embodiment of the present invention.
Figure 8B:
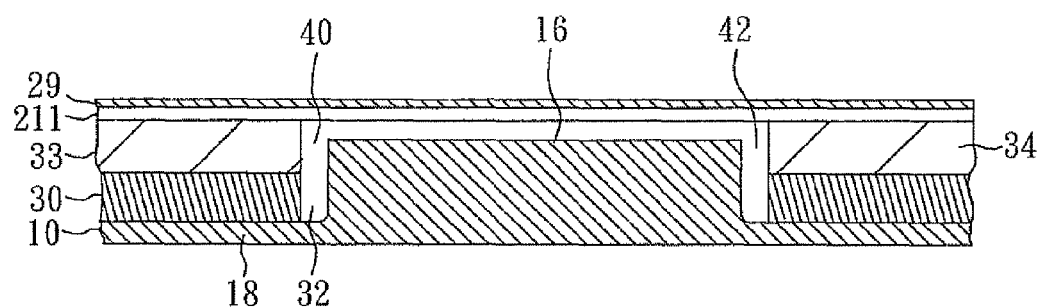

FIG. 8A is a cross-sectional view of sacrificial carrier 10 with bump 16 extending from flange 18 in the upward direction. Sacrificial carrier 10 used in this embodiment is the same as that illustrated in Embodiment 1, except that no stamped cavity is defined in bump 16 and bump 16 has a rectangular cylinder shape with a constant diameter according to this embodiment.

Figure 8C:
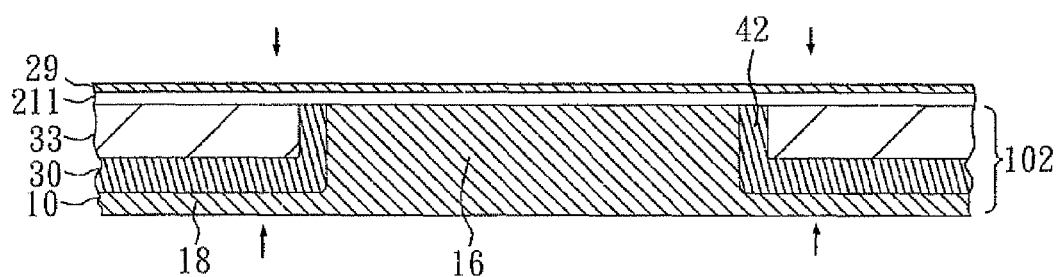
Figure 8D:
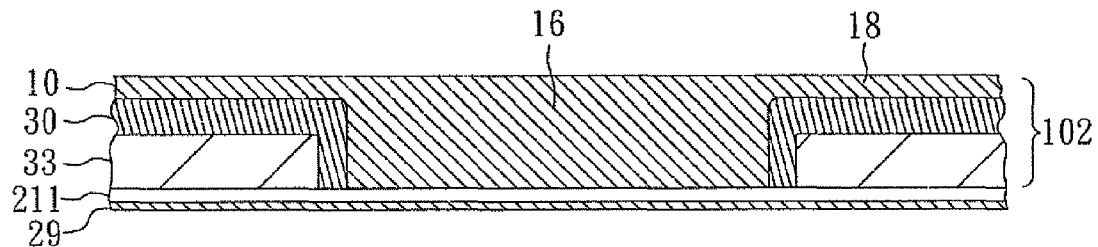
Figure 8E:
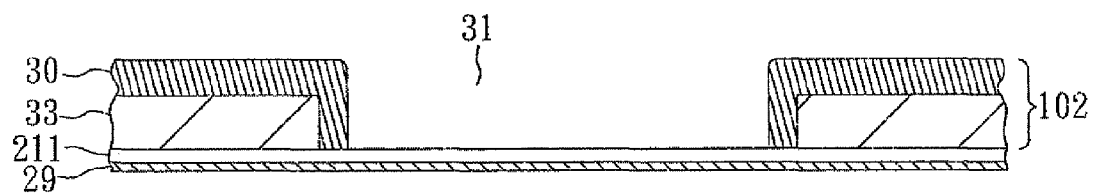

FIG. 8E is a cross-sectional view of the structure with adhesive 30 on flange 18, stiffener 33 on adhesive 30, dielectric layer 211 on stiffener 33 and metal layer 29 on dielectric layer 211. Bump 16 is inserted into opening 32 and aperture 40 without contacting adhesive 30 and stiffener 33 and is aligned with and centrally located within opening 32 and aperture 40. As a result, gap 42 is located in aperture 40 between bump 16 and stiffener 33. In addition, opening 32 and aperture 40 are precisely aligned with one another and have the same dimension, and dielectric layer 211 and metal layer 29 cover stiffener 33 and bump 16 in the upward direction. In this illustration, substrate 34 without conductive layer thereon is applied as stiffener 33.

FIG. 8C is a cross-sectional view of the structure with adhesive 30 in gap 42 and dielectric layer 211 as well as metal layer 29 laminated onto stiffener 33 and bump 16. Adhesive 30 is flowed into gap 42 by applying heat and pressure. In detail, adhesive 30 is forced into gap 42 by applying downward pressure to metal layer 29 and/or upward pressure to sacrificial carrier 10, thereby moving stiffener 33 and sacrificial carrier 10 towards one another and applying pressure to adhesive 30 while simultaneously applying heat to adhesive 30. Adhesive 30 becomes compliant enough under the heat and pressure to conform to virtually any shape. Meanwhile, under the heat and pressure, metal layer 29 is bonded to bump 16 and stiffener 33 by dielectric layer 211 that contacts bumps 16, adhesive 30, stiffener 33 and metal layer 29. Although stiffener 33, adhesive 30 and bump 16 are illustrated as coplanar with one another, they may be practically not coplanar with one another and dielectric layer 211 may also be forced into gap 42.

The upward motion of sacrificial carrier 10 relative to metal layer 29 is shown by the thin upward arrows, and the downward motion of metal layer 29 relative to sacrificial carrier 10 is shown by the thin downward arrows.

After adhesive 30 fills up gap 42 and dielectric layer 211 and metal layer 29 are laminated, adhesive 30 and dielectric layer 211 are solidified. Accordingly, adhesive 30 and dielectric layer 211 as solidified respectively provide secure robust mechanical bonds between sacrificial carrier 10 and stiffener 33, between metal layer 29 and sacrificial carrier 10, and between metal layer 29 and stiffener 33.

At this stage, as shown in FIG. 8C, supporting board 102 is accomplished, which includes sacrificial carrier 10, adhesive 30 and stiffener 33.

FIG. 8D is a cross-sectional view of the structure after it is inverted from FIG. 8C.

FIG. 8E is a cross-sectional view of the structure with dielectric layer 211 exposed from cavity 31. Bump 16 and flange 18 are removed to expose dielectric layer 211, and cavity 31 is defined in adhesive 30. At this stage, as shown in FIG. 8E, supporting board 102 includes adhesive 30 and stiffener 33. Cavity 31 is centrally located within opening 32 and aperture 40, and has a closed end in the downward direction and an open end in the upward direction. At the closed end, cavity 31 is coplanar with adhesive 30 and stiffener 33.

Figure 8F:
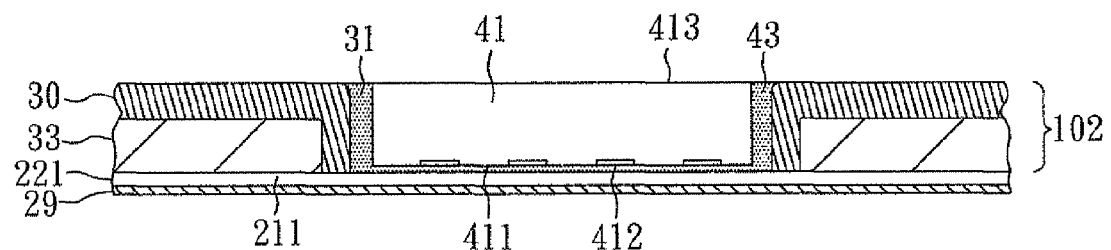

FIG. 8F is a cross-sectional view of the structure with semiconductor device 41 mounted on dielectric layer 211 by die attach 43. Semiconductor device 41, which includes contact pads 412 on active surface 411, is mounted by lowering it into cavity 31, and eventually rests on dielectric layer 211 by die attach 43. Die attach 43 fills the remaining space of cavity 31 and contacts and is sandwiched between dielectric layer 211 and semiconductor device 41 and between adhesive 30 and semiconductor device 41. Accordingly, semiconductor device 41 is bonded to dielectric layer 211 that is considered first insulating layer 221 of build-up circuitry.

Figure 8G:
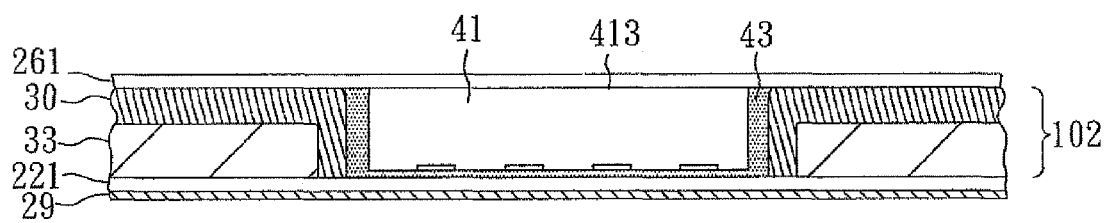

FIG. 8G is a cross-sectional view of the structure with second insulating layer 261 laminated on inactive surface 413 of semiconductor device 41 and stiffener 33 in the upward direction. Second insulating layer 261 contacts and covers adhesive 30, semiconductor device 41 and die attach 43 in the upward direction.

Figure 8H:
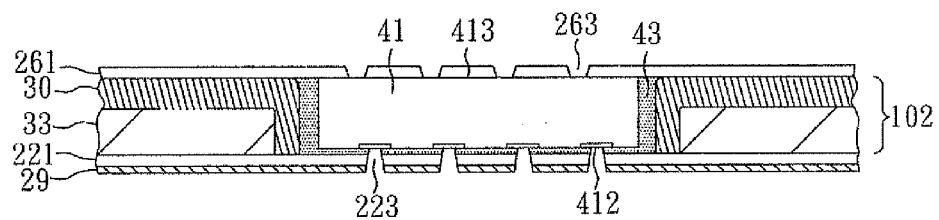

FIG. 8H is a cross-sectional view of the structure provided with first via openings 223 and second via openings 263. First via openings 223 extend through metal layer 29, first insulating layer 221 and die attach 43 to expose contact pads 412 of semiconductor device 41. Second via openings 261 extend through second insulating layer 261 to expose selected portions of inactive surface 413.

Figure 8I:
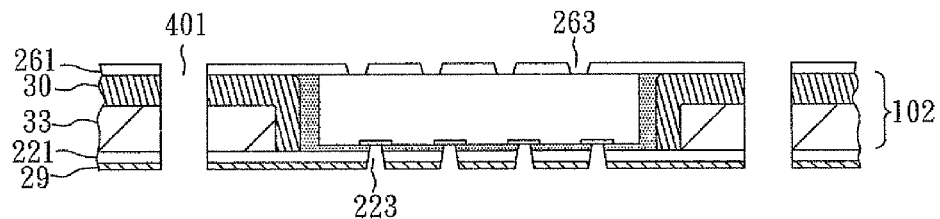

FIG. 8I is a cross-sectional view of the structure provided with through-holes 401. Through-holes 401 extend through metal layer 29, first insulating layer 221, stiffener 33, adhesive 30 and second insulating layer 261 in vertical directions.

Figure 8J:
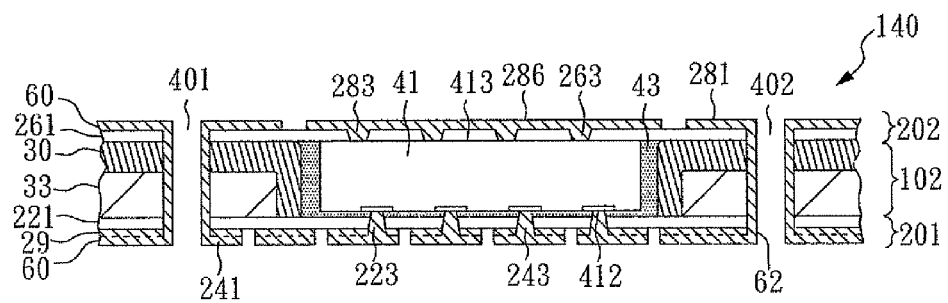

Referring now to FIG. 8J, first conductive traces 241 are formed on first insulating layer 221 by depositing first plated layer 60 on metal layer 29 and into first via openings 223 and then patterning metal layer 29 and first plated layer 60 thereon. Meanwhile, second conductive traces 281 with paddle layer 286 are formed on second insulating later 261 by depositing first plated layer 60 on second insulating layer 261 and into second via openings 263 and then patterning first plated layer 60. Also shown in FIG. 8J is connecting layer 62 deposited in through-holes 401 to provide plated through-holes 402.

Metal layer 29, first plated layer 60 and connecting layer 62 are shown as a single layer for convenience of illustration. The boundary (shown in phantom) between the metal layers may be difficult or impossible to detect since copper is plated on copper. However, the boundary between first plated layer 60 and first insulating layer 221, between first plated layer 60 and second insulating layer 261, between connecting layer 60 and stiffener 33, and between connecting layer 62 and adhesive 30 is clear.

Accordingly, as shown in FIG. 8J, semiconductor assembly 140 is accomplished and includes supporting board 102, semiconductor device 41, die attach 43, dual build-up circuitries 201, 202 and plated through-holes 402. In this illustration, first build-up circuitry 201 includes first insulating layer 221 and first conductive traces 241, while second build-up circuitry 202 includes second insulating layer 261 and second conductive traces 281. First conductive traces 241 extend from first insulating layer 221 in the downward direction, extend laterally on first insulating layer 221 and extend into first via openings 223 in the upward direction to form first conductive vias 243 in electrical contact with contact pads 412 of semiconductor device 41. Second conductive traces 281 extend from second insulating layer 261 in the upward direction, extend laterally on second insulating layer 261 and extend into second via openings 263 to form second conductive vias 283 in electrical contact with inactive surface 413 of semiconductor device 41. Plated through-holes 402 extend through first insulating layer 221, stiffener 33, adhesive 30 and second insulating layer 261 in the vertical directions to provide electrical connection between first conductive traces 241 and second conductive traces 281.

Embodiment 5

Figure 9A:
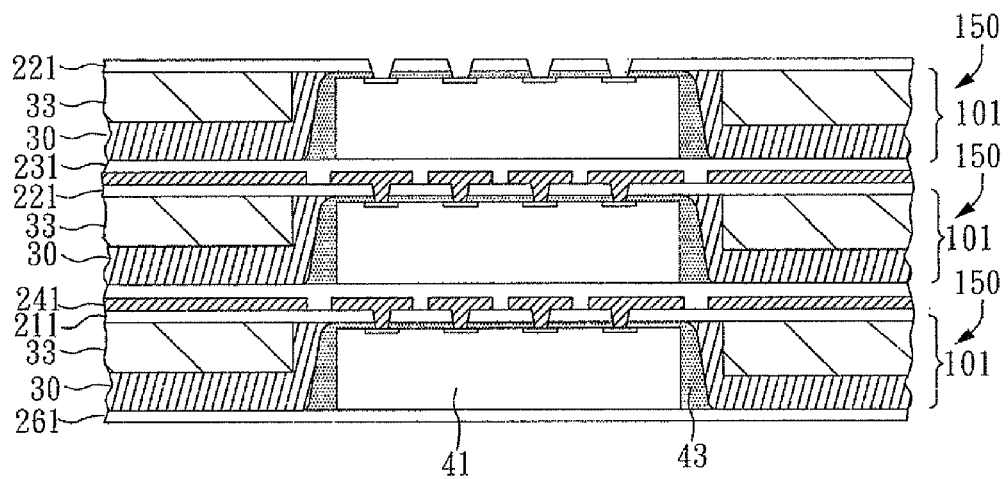
FIGS. 9A-9C are cross-sectional views showing a method of making a stacking module with multiple face-to-back vertically stacked semiconductor assemblies in accordance with an embodiment of the present invention.
Figure 9B:
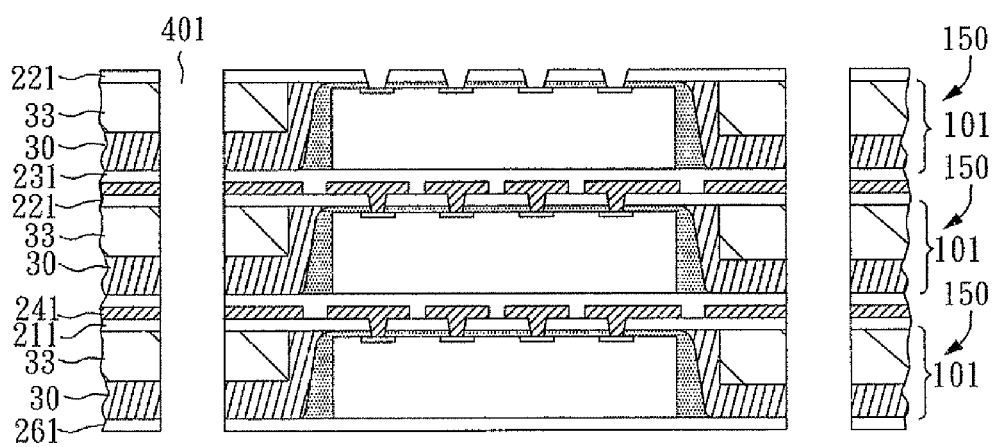
Figure 9C:
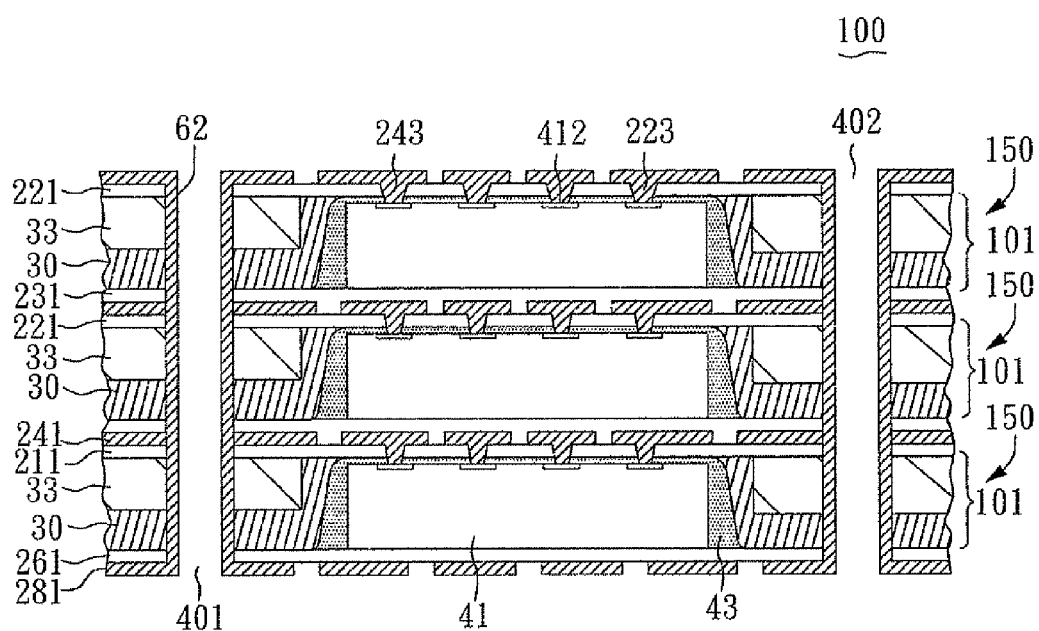

FIGS. 9A-9C are cross-sectional views showing a method of making a stacking module that includes multiple assemblies in face-to-back stacking in accordance with one embodiment of the present invention.

For purposes of brevity, any description in above Embodiments is incorporated herein insofar as the same is applicable, and the same description need not be repeated.

FIG. 9A is a cross-sectional view of the structure with interlayer dielectrics 231 sandwiched between two neighboring assemblies 150. Each assembly 150 is manufactured by the same steps illustrated in FIGS. 1A-5F, except that stiffener 33 includes no conductive layer thereon and first conductive traces 241 do not contact stiffener 33. In this illustration, each assembly 150 includes supporting board 101, semiconductor device 41, die attach 43, first insulating layer 221 and first conductive traces 241, except that the top assembly 150 is not provided with conductive traces yet. Multiple assemblies 150 are vertically stacked and bonded to one another using interlayer dielectric 231 that contacts and is sandwiched between semiconductor device 41/die attach 43/adhesive 30 of upper assembly 150 and first insulating layer 221/first conductive traces 241 of lower assembly 150. Meanwhile, second insulating layer 261 is also laminated onto and contacts semiconductor device 41/die attach 43/adhesive 30 of bottom assembly 150.

FIG. 9B is a cross-sectional view of the structure with through-holes 401. Through-holes 401 extend through assemblies 150 and interlayer dielectrics 231 in the vertical direction. Through-holes 401 are formed by mechanical drilling and can be formed by other techniques such as laser drilling and plasma etching with or without wet etching.

Referring now to FIG. 9C, top assembly 150 is provided with first conductive traces 241, and bottom assembly 150 is provided with second conductor traces 281. First conductive traces 241 extend vertically from first insulating layer 221, extend laterally on first insulating layer 221, and extend into first via openings 223 to form first conductive vias 243 in electrical contact with contact pads 412 of semiconductor device 41. Second conductive traces 281 extend vertically from second insulating layer 261 and extend laterally on second insulating layer 261. Also shown in FIG. 9C is connecting layer 62 deposited in through-holes 401 to provide plated through-holes 402. Accordingly, stacking module 100 is accomplished and includes multiple assemblies 150, interlayer dielectrics 231 and plated through-holes 402. Each assembly 150 includes supporting board 101, semiconductor device 41, die attach 43, first insulating layer 221 and first conductive traces 241, except that bottom assembly 150 further includes second insulating layer 261 and second conductive traces 281. Plated through-holes 402 extend through interlayer dielectrics 231 and assemblies 150 to provide electrical connection assemblies 150.

Embodiment 6

Figure 10A:
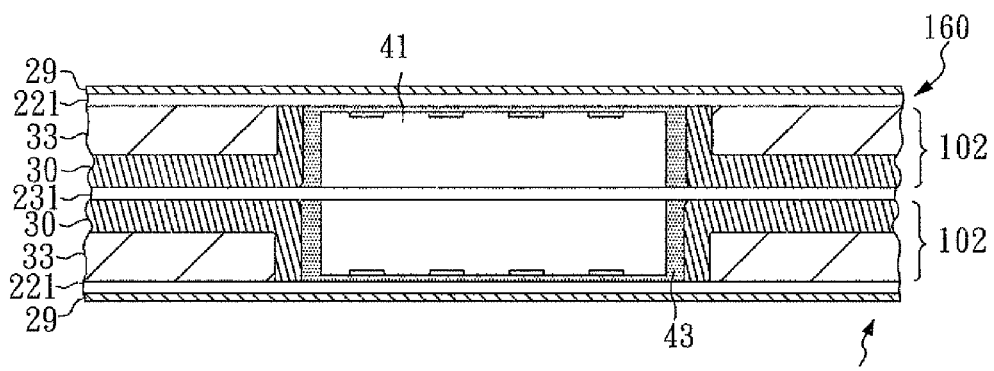
FIGS. 10A-10C are cross-sectional views showing a method of making a stacking module with back-to-back vertically stacked semiconductor assemblies in accordance with another embodiment of the present invention.
Figure 10B:
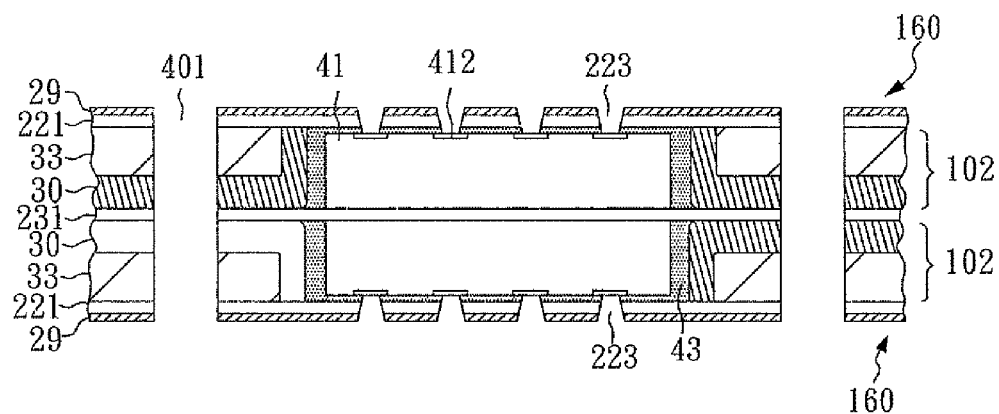
Figure 10C:
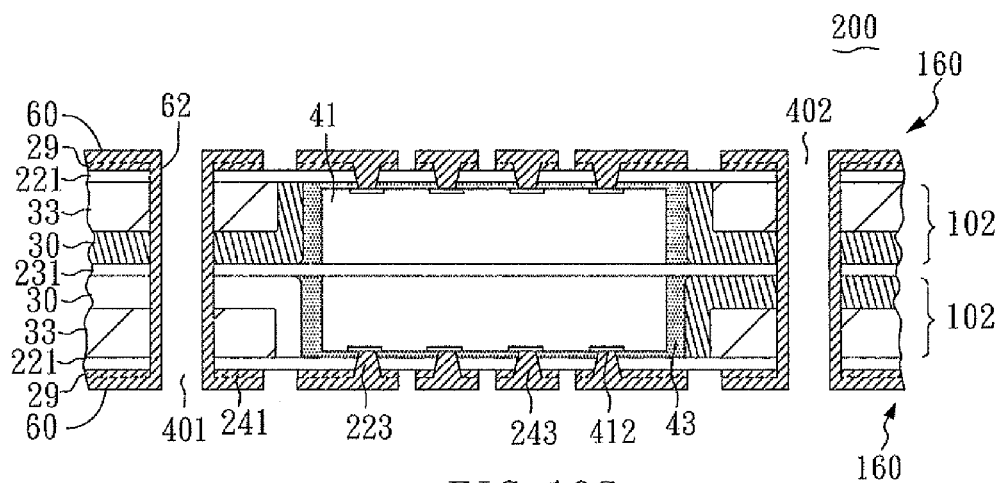

FIGS. 10A-10C are cross-sectional views showing a method of making another stacking module that includes two assemblies in back-to-back stacking in accordance with another embodiment of the present invention.

For purposes of brevity, any description in above Embodiments is incorporated herein insofar as the same is applicable, and the same description need not be repeated.

FIG. 10A is a cross-sectional view of the structure with interlayer dielectrics 231 sandwiched between two assemblies 160. Each assembly 160 is manufactured by the steps illustrated in FIGS. 8A-8F and includes supporting board 102, semiconductor device 41, die attach 43, first insulating layer 221 and metal layer 29. Assemblies 160 are vertically stacked in back-to back manner and bonded to one another using interlayer dielectric 231 that is sandwiched between two assemblies 160 and contacts semiconductor device 41, die attach 43 and adhesive 30 of each assembly 160.

FIG. 10B is a cross-sectional view of the structure with first via openings 223 and through-holes 401. First via openings 223 extend through metal layer 29, first insulating layer 221 and die attach 43 to expose contact pads 412 of semiconductor device 41 in each assembly 160. Through-holes 401 extend through assemblies 160 and interlayer dielectrics 231 in the vertical direction. Through-holes 401 are formed by mechanical drilling and can be formed by other techniques such as laser drilling and plasma etching with or without wet etching.

Referring now to FIG. 10C, each assembly 160 is provided with first conductive traces 241 by depositing first plated layer 60 on metal layer 29 and into first via openings 223 and then patterning metal layer 29 and first plated layer 60 thereon. First conductive traces 241 extend vertically from first insulating layer 221, extend laterally on first insulating layer 221, and extend into first via openings 223 to form first conductive vias 243 in electrical contact with contact pads 412 of semiconductor device 41. Also shown in FIG. 10C is connecting layer 62 deposited in through-holes 401 to provide plated through-holes 402. Accordingly, stacking module 200 is accomplished and includes dual assemblies 160, interlayer dielectrics 231 and plated through-holes 402. Each assembly 160 includes supporting board 102, semiconductor device 41, die attach 43, first insulating layer 221 and first conductive traces 241. Plated through-holes 402 extend through interlayer dielectrics 231 and assemblies 160 to provide electrical connection between top and bottom assemblies 160.

The semiconductor assemblies and 3D stacking structures described above are merely exemplary. Numerous other embodiments are contemplated. In addition, the embodiments described above can be mixed-and-matched with one another and with other embodiments depending on design and reliability considerations. For instance, the stiffener can include ceramic material or epoxy-based laminate, and can have embedded single-level conductive traces or multi-level conductive traces. The supporting board can include multiple bumps to define multiple cavities in the adhesive. Accordingly, the assembly can include multiple cavities arranged in an array for multiple semiconductor devices, and the build-up circuitry can includes additional circuitries to accommodate additional semiconductor devices.

The semiconductor device can share or not share the cavity with other semiconductor devices. For instance, a single semiconductor device can be mounted into the built-in cavity. Alternatively, numerous semiconductor devices can be mounted into the built-in cavity. For instance, four small chips in a 2×2 array can be placed in the built-in cavity and additional conductive vias can be provided for additional chips. This may be more cost effective than providing a miniature cavity for each chip.

The semiconductor device can be a packaged or unpackaged chip. Furthermore, the semiconductor device can be a bare chip, LGA, or QFN, etc. Furthermore, the built-in cavity can be customized for the semiconductor device embedded therein. For instance, the cavity can have a square or rectangular shape at its bottom with the same or similar topography as the semiconductor device.

The supporting board can provide a robust mechanical support for the build-up circuitry, and the build-up circuitry provides shorten signal routing so that signal loss and distortion can be reduced under accelerated operation of the semiconductor device.

The term "adjacent" refers to elements that are integral (single-piece) or in contact (not spaced or separated from) with one another. For instance, the bump is adjacent to the flange but not the stiffener.

The term "overlap" refers to above and extending within a periphery of an underlying element. Overlap includes extending inside and outside the periphery or residing within the periphery. For instance, in the cavity-up position, the flange overlaps the stiffener since an imaginary vertical line intersects the flange and the stiffener, regardless of whether another element such as the adhesive is between the flange and the stiffener and is intersected by the line, and regardless of whether another imaginary vertical line intersects the flange but not the stiffener (within the aperture of the stiffener). Likewise, the adhesive overlaps the stiffener, the flange overlaps the adhesive and the stiffener is overlapped by the adhesive. Moreover, overlap is synonymous with over and overlapped by is synonymous with under or beneath.

The term "contact" refers to direct contact. For instance, the stiffener contacts the adhesive but does not contact the bump.

The term "cover" refers to incomplete and complete coverage in a vertical and/or lateral direction. For instance, in the cavity-up position, the adhesive covers the stiffener but does not cover the bump in the upward direction.

The term "layer" refers to patterned and un-patterned layers. For instance, the conductive layer can be an un-patterned blanket sheet on the substrate when the stiffener including the conductive layer and the substrate is mounted on the adhesive. Furthermore, a layer can include stacked layers.

The terms "opening" and "aperture" and "hole" refer to a through hole and are synonymous. For instance, in the cavity-down position, the bump is exposed by the adhesive in the upward direction when it is inserted into the opening in the adhesive. Likewise, the bump is exposed by the stiffener in the upward direction when it is inserted into the aperture in the stiffener.

The term "inserted" refers to relative motion between elements. For instance, the bump is inserted into the aperture regardless of whether the flange is stationary and the stiffener moves towards the flange, the stiffener is stationary and the flange moves towards the stiffener or the flange and the stiffener both approach the other. Furthermore, the bump is inserted (or extends) into the aperture regardless of whether it goes through (enters and exits) or does not go through (enters without exiting) the aperture.

The phrase "move towards one another" also refers to relative motion between elements. For instance, the flange and the stiffener move towards one another regardless of whether the flange is stationary and the stiffener moves towards the flange, the stiffener is stationary and the flange moves towards the stiffener or the flange and the stiffener both approach the other.

The phrase "aligned with" refers to relative position between elements. For instance, the bump is aligned with the aperture when the adhesive is mounted on the flange, the stiffener is mounted on the adhesive, the bump is inserted into and aligned with the opening and the aperture is aligned with the opening regardless of whether the bump is inserted into the aperture or is below and spaced from the aperture.

The phrases "mounted on", "attached onto", "attaching . . . onto", "laminated onto" and "laminating . . . onto" include contact and non-contact with a single or multiple support element(s). For instance, the semiconductor device can be mounted on the dielectric layer regardless of whether it contacts the dielectric layer or is separated from the dielectric layer by a die attach.

The phrase "adhesive . . . in the gap" refers to the adhesive in the gap. For instance, adhesive that extends across the stiffener in the gap refers to the adhesive in the gap that extends across the stiffener. Likewise, adhesive that contacts and is sandwiched between the bump and the stiffener in the gap refers to the adhesive in the gap that contacts and is sandwiched between the bump at the inner sidewall of the gap and the stiffener at the outer sidewall of the gap.

The phrase "electrical connection" or "electrically connects" or "electrically connected" refers to direct and indirect electrical connection. For instance, the plated through-hole provides an electrical connection for the first conductive traces regardless of whether it is adjacent to the first conductive traces or electrically connected to the first conductive traces by the inner pad.

The term "above" refers to upward extension and includes adjacent and non-adjacent elements as well as overlapping and non-overlapping elements. For instance, in the cavity-down position, the bump extends above, is adjacent to and protrudes from the flange.

The term "below" refers to downward extension and includes adjacent and non-adjacent elements as well as overlapping and non-overlapping elements. For instance, in the cavity-up position, the bump extends below, is adjacent to and protrudes from flange in the downward direction. Likewise, the bump extends below the stiffener even though it is not adjacent to or overlapped by the stiffener.

The "first vertical direction" and "second vertical direction" do not depend on the orientation of the semiconductor assembly (or the supporting board), as will be readily apparent to those skilled in the art. For instance, the bump extends vertically beyond the stiffener in the second vertical direction and vertically beyond the flange in the first vertical direction regardless of whether the supporting board is inverted. Likewise, the flange extends "laterally" from the bump in a lateral plane regardless of whether the supporting board is inverted, rotated or slanted. Thus, the first and second vertical directions are opposite one another and orthogonal to the lateral directions, and laterally aligned elements are coplanar with one another at a lateral plane orthogonal to the first and second vertical directions. Furthermore, the first vertical direction is the downward direction and the second vertical direction is the upward direction in the cavity-up position, and the first vertical direction is the upward direction and the second vertical direction is the downward direction in the cavity-down position.

The semiconductor assembly and the stacking module using the same according to the present invention have numerous advantages. The semiconductor assembly made by this method and the stacking module using the same are reliable, inexpensive and well-suited for high volume manufacture. The assembly is especially well-suited for high power semiconductor devices and large semiconductor chips as well as multiple semiconductor devices such as small semiconductor chips in arrays which generate considerable heat and require excellent heat dissipation in order to operate effectively and reliably.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional packaging techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

What is claimed is:

1. A method of making a semiconductor assembly, comprising:
providing a dielectric layer and a supporting board that includes a sacrificial carrier, a stiffener and an adhesive, wherein (i) the sacrificial carrier includes a bump and a flange, (ii) the bump is adjacent to and integral with the flange and extends from the flange in a first vertical direction, (iii) the flange extends laterally from the bump in lateral directions orthogonal to the first vertical direction, (iv) the stiffener is attached to the sacrificial carrier via the adhesive between the stiffener and the flange and between the stiffener and the bump, and (v) the dielectric layer covers the supporting board in the first vertical direction;
removing the bump and a portion of the flange adjacent to the bump to form a cavity and expose the dielectric layer from a closed end of the cavity, wherein the cavity is laterally covered and surrounded by the adhesive and faces in a second vertical direction opposite the first vertical direction;
mounting a semiconductor device into the cavity, wherein the semiconductor device includes an active surface with a contact pad thereon that faces the first vertical direction and an inactive surface that faces the second vertical direction; and
forming a first build-up circuitry that covers the semiconductor device and the supporting board in the first vertical direction and includes a first conductive via that directly contacts the contact pad of the semiconductor device to provide an electrical connection between the semiconductor device and the first build-up circuitry.

2. The method of claim 1, further comprising:
forming a second build-up circuitry that covers the semiconductor device and the supporting board in the second vertical direction; and
providing a plated through-hole that extends through the supporting board in the vertical directions to provide an electrical connection between the first build-up circuitry and the second build-up circuitry.

3. The method of claim 1, wherein the electrical connection between the semiconductor device and the first build-up circuitry is devoid of solder.

4. The method of claim 1, wherein the sacrificial carrier further includes a stamped cavity in the bump, and the stamped cavity is covered by the bump in the first vertical direction.

5. The method of claim 1, wherein providing the supporting board includes:
providing the sacrificial carrier that includes the bump and the flange; and
attaching the stiffener to the sacrificial carrier via the adhesive between the stiffener and the flange and between the stiffener and the bump, including aligning the bump with an aperture of the stiffener.

6. The method of claim 5, wherein providing the sacrificial carrier includes mechanically stamping a metal plate.

7. The method of claim 5, wherein attaching the stiffener to the sacrificial carrier via the adhesive includes:
providing the adhesive that is non-solidified between the flange of the sacrificial carrier and the stiffener, including aligning the bump of the sacrificial carrier with an opening of the adhesive and the aperture of the stiffener; then
flowing the adhesive into a gap located in the aperture between the bump and the stiffener; and then
solidifying the adhesive, thereby mechanically attaching the stiffener to the bump and the flange.

8. The method of claim 2, wherein forming the first build-up circuitry and the second build-up circuitry includes:
providing a first insulating layer that includes the dielectric layer and covers the semiconductor device and the supporting board in the first vertical direction;
providing a second insulating layer that covers the semiconductor device and the supporting board in the second vertical direction;
forming a first via opening that extends through the first insulating layer and is aligned with the contact pad of the semiconductor device;
forming a first conductive trace that extends from the first insulating layer in the first vertical direction and extends laterally on the first insulating layer and extends through the first via opening in the second vertical direction to form the first conductive via in direct contact with the contact pad of the semiconductor device; and
forming a second conductive trace that extends from the second insulating layer in the second vertical direction and extends laterally on the second insulating layer.

9. The method of claim 8, wherein forming the first build-up circuitry includes:
forming an additional first via opening that extends through the first insulating layer and is aligned with the stiffener; and then
forming the first conductive trace that extends through the additional first via opening in the second vertical direction to form an additional first conductive via in direct contact with the stiffener.

10. The method of claim 8, wherein forming the second build-up circuitry includes:
forming a second via opening that extend through the second insulating layer and is aligned with the inactive surface of the semiconductor device; and then
forming the second conductive trace that extends through the second via opening in the first vertical direction to form a second conductive via in direct contact with the inactive surface of the semiconductor device.

11. The method of claim 2, wherein providing the plated through-hole includes:
forming a through-hole that extends through the stiffener and the adhesive in the vertical directions; and then
depositing a connecting layer on an inner sidewall of the through-hole.

12. The method of claim 1, wherein removing the bump and the portion of the flange adjacent to the bump includes chemical etching process.

13. A semiconductor assembly prepared by a method that comprises steps of:
providing a dielectric layer and a supporting board that includes a sacrificial carrier, a stiffener and an adhesive, wherein (i) the sacrificial carrier includes a bump and a flange, (ii) the bump is adjacent to and integral with the flange and extends from the flange in a first vertical direction, (iii) the flange extends laterally from the bump in lateral directions orthogonal to the first vertical direction, (iv) the stiffener is attached to the sacrificial carrier via the adhesive between the stiffener and the flange and between the stiffener and the bump, and (v) the dielectric layer covers the supporting board in the first vertical direction;

removing the bump and a portion of the flange adjacent to the bump to form a cavity and expose the dielectric layer from a closed end of the cavity, wherein the cavity is laterally covered and surrounded by the adhesive and faces in a second vertical direction opposite the first vertical direction;

mounting a semiconductor device into the cavity, wherein the semiconductor device includes an active surface with a contact pad thereon that faces the first vertical direction and an inactive surface that faces the second vertical direction; and forming a first build-up circuitry that covers the semiconductor device and the supporting board in the first vertical direction and includes a first conductive via that directly contacts the contact pad of the semiconductor device to provide an electrical connection between the semiconductor device and the first build-up circuitry.

14. The semiconductor assembly of claim 13, wherein the method further comprises:

forming a second build-up circuitry that covers the semiconductor device and the supporting board in the second vertical direction; and providing a plated through-hole that extends through the supporting board in the vertical directions to provide an electrical connection between the first build-up circuitry and the second build-up circuitry.

15. The semiconductor assembly of claim 14, wherein the hybrid wiring board comprises:

the cavity that has a closed end in the first vertical direction and an open end in the second vertical direction;

the stiffener that includes an aperture, wherein the cavity extends into the aperture;

the adhesive that laterally covers and surrounds and conformally coats a sidewall of the cavity, extends laterally from the cavity to peripheral edges of the assembly and covers and contacts the stiffener in the second vertical direction;

the semiconductor device that extends into the cavity and includes the contact pad that faces the closed end of the cavity and the inactive surface that faces the open end of the cavity;

the first build-up circuitry that covers the semiconductor device, the adhesive and the stiffener in the first vertical direction and includes the first conductive via that directly contacts the contact pad of the semiconductor device;

the second build-up circuitry that covers the semiconductor device and the adhesive in the second vertical direction; and the plated through-hole that extends through the stiffener and the adhesive in the vertical directions to provide an electrical connection between the first build-up circuitry and the second build-up circuitry.

16. The semiconductor assembly of claim 13, wherein the adhesive has a first thickness where it is adjacent to the sidewall of the cavity and a second thickness where it covers the stiffener in the second vertical direction that is different from the first thickness.

* * * * *